(12) United States Patent
Diller et al.

(10) Patent No.: US 10,795,324 B2
(45) Date of Patent: *Oct. 6, 2020

(54) CONTROLLER

(71) Applicant: Ecolab USA Inc., Saint Paul, MN (US)

(72) Inventors: Christopher D. Diller, Bloomington, MN (US); Louis M. Holzman, St. Paul, MN (US); Ronald B. Howes, Minneapolis, MN (US); Stephen X. Skaff, Apple Valley, MN (US); Quang Van Dao, Eden Prairie, MN (US); Christopher A. Buck, St. Paul, MN (US)

(73) Assignee: Ecolab USA Inc., Saint Paul, MN (US)

( * ) Notice: Subject to any disclaimer, the term of this patent is extended or adjusted under 35 U.S.C. 154(b) by 660 days.

This patent is subject to a terminal disclaimer.

(21) Appl. No.: 14/990,545

(22) Filed: Jan. 7, 2016

(65) Prior Publication Data

US 2016/0223996 A1 Aug. 4, 2016

Related U.S. Application Data

(63) Continuation of application No. 13/475,416, filed on May 18, 2012, now Pat. No. 9,261,866.
(Continued)

(51) Int. Cl.
*G05B 11/01* (2006.01)
*H05B 47/175* (2020.01)
(Continued)

(52) U.S. Cl.
CPC .............. *G05B 11/01* (2013.01); *G05B 15/02* (2013.01); *H05B 47/175* (2020.01);
(Continued)

(58) Field of Classification Search
CPC ..... G06F 1/182; Y04S 40/168; H05K 9/0024; H05K 9/0049; H05K 5/0017; H05K 5/03;
(Continued)

(56) References Cited

U.S. PATENT DOCUMENTS

| 4,732,281 A | 3/1988 | Hall et al. |
| 5,257,164 A | 10/1993 | Perez et al. |

(Continued)

FOREIGN PATENT DOCUMENTS

| CN | 201114189 Y | 9/2008 |
| EP | 1696303 | 8/2006 |

(Continued)

OTHER PUBLICATIONS

Haworth et al., "Watertight electrical connector for undersea vehicles and components", Navel Engineers Journal, Aug. 1965, pp. 562-572 (Year: 1965).*

(Continued)

*Primary Examiner* — Vincent Wall
(74) *Attorney, Agent, or Firm* — McKee, Voorhees & Sease, PLC

(57) ABSTRACT

A controlling and monitoring control application associated with one or more work operations of one or more utility devices is disclosed. The controller is programmed for controlling one or more external work operations associated with one or more utility devices. An I/O board is connected in communication with the primary controller having a module with a plurality of device-specific control applications associated with one or more device-specific work operations. The housing of the controller includes one or more cable access points for plugging a cable into the controller. The cable access points are sealed to prevent water from entering into the housing. A mounting bracket assembly provides flexibility for mounting the controller at (Continued)

various orientations and/or positions. The controller also includes a DC control circuit for controlling backlight luminance over the entire dimming ratio.

12 Claims, 24 Drawing Sheets

Related U.S. Application Data

(60) Provisional application No. 61/488,495, filed on May 20, 2011.

(51) Int. Cl.
| | | |
|---|---|---|
| *G05B 15/02* | (2006.01) | |
| *H05K 5/00* | (2006.01) | |
| *H05K 5/03* | (2006.01) | |
| *H05K 5/06* | (2006.01) | |
| *G09G 3/34* | (2006.01) | |
| *H05B 45/20* | (2020.01) | |

(52) U.S. Cl.
CPC .............. *H05K 5/0017* (2013.01); *H05K 5/03* (2013.01); *H05K 5/061* (2013.01); *G05B 2219/2642* (2013.01); *G09G 3/3406* (2013.01); *G09G 2320/064* (2013.01); *H05B 45/20* (2020.01)

(58) Field of Classification Search
CPC ........ H05K 5/061; G05B 11/01; G05B 15/02; G05B 2219/2642; G09G 2320/064; G09G 3/3406; G01L 1/005; G01L 1/26
See application file for complete search history.

(56) References Cited

U.S. PATENT DOCUMENTS

| | | | |
|---|---|---|---|
| 5,262,762 A | | 11/1993 | Westover et al. |
| 5,310,075 A | * | 5/1994 | Wyler ..................... F21V 31/00 174/50 |
| 5,320,311 A | | 6/1994 | Jensen et al. |
| 5,420,828 A | | 5/1995 | Geiger |
| 5,588,853 A | | 12/1996 | Anthony |
| 5,836,563 A | | 11/1998 | Hsin-Yung |
| 5,895,022 A | | 4/1999 | Kim |
| 5,907,222 A | | 5/1999 | Lengyel et al. |
| 6,112,224 A | | 8/2000 | Peifer et al. |
| 6,129,321 A | | 10/2000 | Minelli et al. |
| 6,446,913 B1 | | 9/2002 | Schroeder |
| 6,502,265 B2 | * | 1/2003 | Blair ..................... D06F 39/005 340/4.31 |
| 6,504,707 B2 | | 1/2003 | Agata et al. |
| 6,987,787 B1 | | 1/2006 | Mick |
| 7,118,000 B2 | | 10/2006 | Shea |
| 7,174,227 B2 | * | 2/2007 | Kobayashi .............. D06F 33/02 700/83 |
| 7,401,755 B2 | | 7/2008 | Wu |
| 7,688,580 B2 | | 3/2010 | Richardson et al. |
| 8,472,186 B2 | | 6/2013 | Probst et al. |
| 8,808,463 B2 | | 8/2014 | Rolek et al. |
| 2001/0039501 A1 | * | 11/2001 | Crevel ............... G05B 19/0428 700/90 |
| 2003/0137148 A1 | | 7/2003 | Andre et al. |
| 2004/0143368 A1 | * | 7/2004 | May ..................... H04L 12/2803 700/241 |
| 2004/0260427 A1 | * | 12/2004 | Wimsatt ................. G05B 15/02 700/275 |
| 2005/0288071 A1 | | 12/2005 | Wu |
| 2006/0021154 A1 | * | 2/2006 | Ha ........................ D06F 39/005 8/158 |
| 2006/0054335 A1 | * | 3/2006 | Rapp .................... G01G 21/283 174/481 |
| 2006/0244870 A1 | | 11/2006 | Yamato et al. |
| 2006/0273081 A1 | | 12/2006 | Fernandez et al. |
| 2007/0014491 A1 | | 1/2007 | MacAuley et al. |
| 2008/0004904 A1 | | 1/2008 | Tran |
| 2008/0224542 A1 | * | 9/2008 | Freeman .................. G05B 9/02 307/66 |
| 2009/0086459 A1 | | 4/2009 | Bicket et al. |
| 2010/0070089 A1 | | 3/2010 | Harrod et al. |
| 2010/0107076 A1 | | 4/2010 | Grohman et al. |
| 2010/0161082 A1 | * | 6/2010 | Ebrom ................... G05B 15/02 700/17 |
| 2010/0170303 A1 | | 7/2010 | Gohl et al. |
| 2010/0324726 A1 | * | 12/2010 | Liu ........................ G06Q 30/06 700/236 |
| 2011/0267387 A1 | | 11/2011 | Baik et al. |
| 2012/0037185 A1 | * | 2/2012 | Ellingson ............ A47L 15/0005 134/18 |
| 2012/0109395 A1 | | 5/2012 | Finch et al. |
| 2012/0221149 A1 | | 8/2012 | Kasper |
| 2016/0147242 A1 | * | 5/2016 | Kaufman .................. G05F 1/66 700/291 |

FOREIGN PATENT DOCUMENTS

| | | |
|---|---|---|
| EP | 2210533 | 7/2010 |
| WO | 2004059404 | 7/2004 |
| WO | 2004068250 A2 | 8/2004 |
| WO | 2009137397 A1 | 11/2009 |

OTHER PUBLICATIONS

Ecolab USA, Inc., PCT/US12/38636. "Notification of Transmittal of the International Search Report and the Written Opinion of the International Searching Authority, or the Declaration", dated Sep. 18, 2012.

Ecolab USA Inc., PCT/US2012/038644 filed May 18, 2012, "Notification of Transmittal of the The International Search Report and the Written Opinion of the International Seraching Authority" dated Oct. 18, 2012.

* cited by examiner

Primary Control Board — 68

Control Board

| Display Module (Bitmap or QVGA) | JTAG | Keypad Module | TabletPC, etc. Communications Module (Ethernet, WiFi, USB, etc.) | | |
|---|---|---|---|---|---|
| Logic-Level Power Supply | FPGA for low-level "glue" | Hard-button Keypad Module | | | |
| | | Soft-button Keypad Module | | | |
| GPIO / Diagnostic LEDs | External RAM | Real-Time Clock | RTOS (Open-source, Homegrown, Licensed) | Speaker/Alarm w/Volume Control | |
| Primary Control Microprocessor Module | "Extra" RS-485 Port | Non-Volatile Memory | High Performance Clock Speed | Ambient-Noise Compensated Alarm Volume | |
| Control System Network Communications Module | | | | | |

FIG. 5

I/O Board – OPL　(70)

OPL Dispensing I/O

| Relay Output Module (Multi-Channel) | Valve Driver Module (Multi-Channel) | Digital Sensor Input Module (float switch, IR sensor) (Multi-Channel) |
|---|---|---|
| OPL I/O Microprocessor Module | | Brushless Motor Control Module (Multi-Channel) |
| Control System Network Communications Module (RS-485) | "BF" Power Supply | Conductivity Module |

CONTROLLER

CROSS-REFERENCE TO RELATED APPLICATIONS

This application is a divisional application of U.S. Ser. No. 13/475,416, filed on May 18, 2012, which claims priority under 35 U.S.C. § 119 to provisional application Ser. No. 61/488,495 filed May 20, 2011, all of which are herein incorporated by reference in their entirety.

BACKGROUND OF THE INVENTION

Field of the Invention

The invention relates generally to a universal controller for utility devices, and more particularly to a universal controller for controlling and monitoring control applications associated with one or more work operations for one or more utility devices associated with, for example, hospitality, industrial and healthcare markets.

Description of the Prior Art

Utility devices are generally controlled and monitored by a device-specific controller. For example, a product dispenser for a ware washing system is controlled and monitored by a dispenser controller whereas the ware washing system is controlled by a separate ware washing controller. Since the dedicated controls and hardware for each controller are also included in the controller enclosure, the controllers are difficult to position in highly accessible locations such as on the front of a utility device. A controller enclosure is often also subjected to interrogation by environmental conditions resulting from the utility device or the operating environment. For example, controller electronics and hardware can degrade and fail over time by exposure to the steam and moisture byproducts of the ware washing process. Thus, controllers often are located a distance from the utility device it controls to prevent damage to the enclosure. Not only are controller degradation and accessibility a concern, but so is communicating data to and from the controller especially via wired connections. Often, user interface points allow conditions within the environment, such as moisture, to enter and degrade the controller and its components.

It is therefore desirable to provide a controller capable of simultaneously monitoring and controlling multiple utility devices, such as those associated with, for example, hospitality, industrial and healthcare markets that can be positioned at any location on or adjacent to a utility device regardless of the environmental conditions.

It is further desirable to provide a controller that is accessible upon need by wired connection regardless of the environmental conditions at the install location.

It is further desirable to provide a controller capable of monitoring user interaction with one or more utility devices, even simultaneously, for purposes of determining compliance and for auditing use and operation of the utility device(s).

SUMMARY OF THE INVENTION

In one embodiment, the invention is a controller for simultaneous operation of multiple utility devices in one or more hospitality or healthcare industries. The controller includes a primary controller having a multi-tasking operating system and a plurality of native control applications for controlling one or more native work operations. A plurality of external control applications are loaded onto the primary controller for controlling at least one or more external work operations associated with a utility device for providing hospitality or healthcare services. One or more of the native and external control applications are operated simultaneously to monitor and control the native and external work operations. In a preferred form, the controller includes a first set of hospitality or healthcare device controls for one external operation and a second set of hospitality or healthcare device controls for another external work operation. Two or more sets of the device controls for one or more external operations are controlled simultaneously by the primary controller. Additionally, the native and external work operations are monitored and controlled simultaneously. At least one I/O board is connected in communication with the primary controller having a module with a plurality of device-specific control applications associated with one or more device-specific work operations. Operating code is loaded onto the primary controller for executing and monitoring one or more hospitality or healthcare device-specific work operations, includes at least one device-specific module connected to the primary controller to monitor and control the one or more external work operations.

In another embodiment, the invention is a controller for simultaneous operation of multiple hospitality devices. The controller includes a primary controller having a multitasking operating system and a plurality of native control applications for controlling one or more native work operations. The primary controller is loaded with a plurality of external control applications for controlling at least one or more hospitality operations associated with a hospitality device. The native and external control applications may be operated simultaneously to monitor and control the native control applications and the hospitality operations associated with a hospitality device. In a preferred form, the hospitality device includes, amongst other potential devices, at least a ware washing device, an on-premise laundry device, a pool or spa device, an on-site chemistry generation and dispensing device, or a water conditioning device. Also, two or more sets of hospitality device controls for one or more hospitality device operations are controlled or monitored simultaneously by the primary controller.

In another embodiment, the invention is a DC control circuit for controlling back light dimming of an LCD display. The DC control circuit includes a DC output current adapted for powering a lamp and a pulse width modulator adapted for modulating the output current. A capacitance filter filters the output current. In a preferred form, the luminance of the back light is proportional to the output current. The dimming ratio is at least 2000:1 and the luminance is linear over the entire dimming ratio.

In another embodiment, the invention is a method for controlling and monitoring simultaneous operation of multiple hospitality and healthcare devices. A primary controller is provided having a multitasking operating system and a plurality of native control applications for controlling one or more native work operations. A plurality of external control applications are loaded onto the primary controller for controlling at least one or more external work operations associated with a hospitality or healthcare device. The native and external control applications operate simultaneously to monitor and control the native and external work operations. In a preferred form, the method includes simultaneously monitoring and controlling the external work operations of two or more hospitality or healthcare devices, simultaneously monitoring and controlling two or more sets of hospitality or healthcare device controls for one or more external work operations, and simultaneously monitoring and controlling the native and external work operations.

BRIEF DESCRIPTION OF THE DRAWINGS

FIG. 5 illustrates the primary control board of the controller in more detail in accordance with an embodiment of the present invention.

FIG. 6 illustrates an I/O board for an on-premise laundry (OPL) in more detail in accordance with an embodiment of the present invention.

FIG. 10 illustrates various control board configurations in more detail for controlling one or more utility devices in accordance with an embodiment of the present invention.

FIG. 11 illustrates additional control board configurations in more detail for controlling one or more utility devices in accordance with an embodiment of the present invention.

DETAILED DESCRIPTION OF THE PREFERRED EMBODIMENTS

Figure 1:
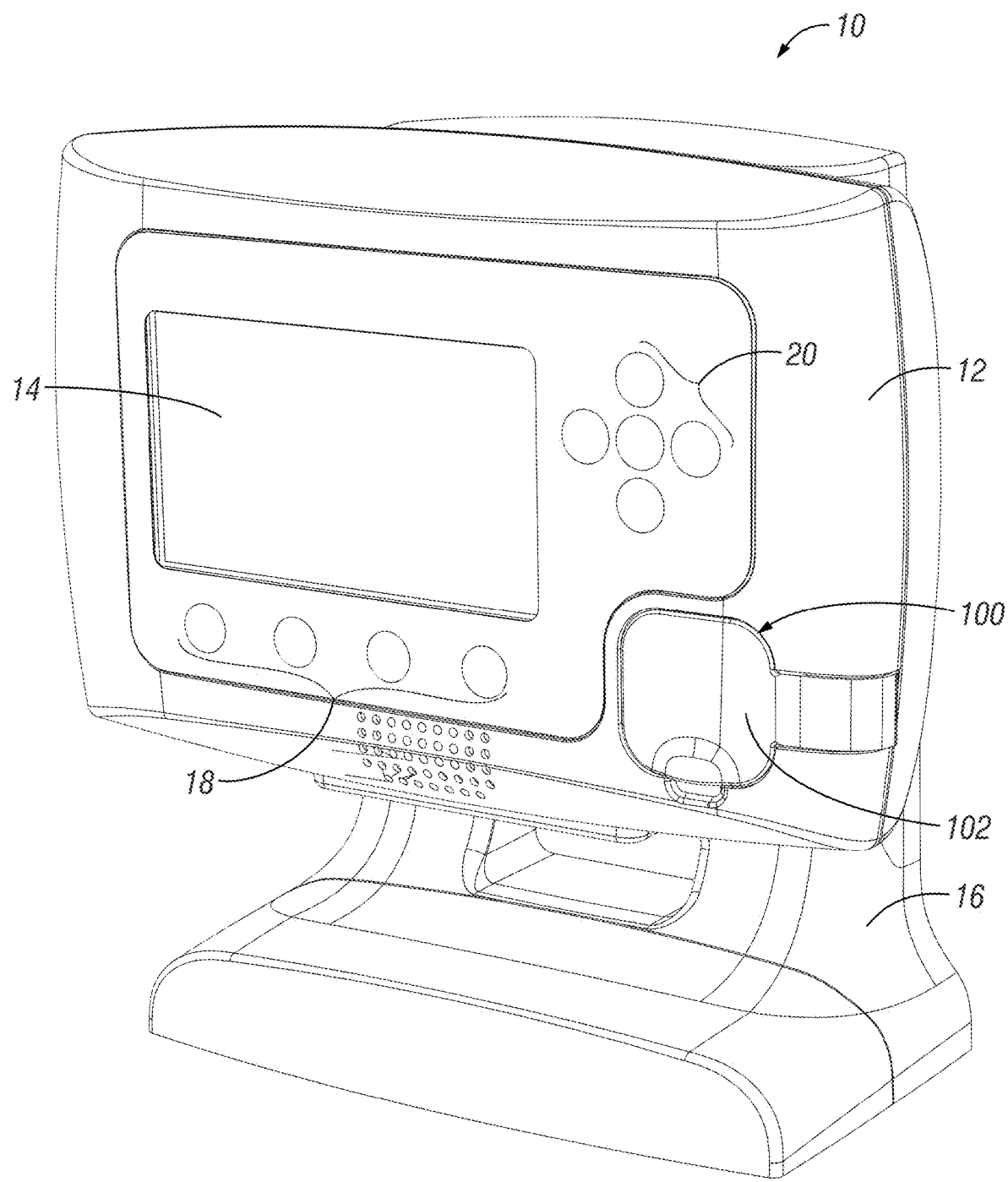
FIG. 1 is a perspective view of a universal controller in accordance with an embodiment of the present invention.
Figure 2:
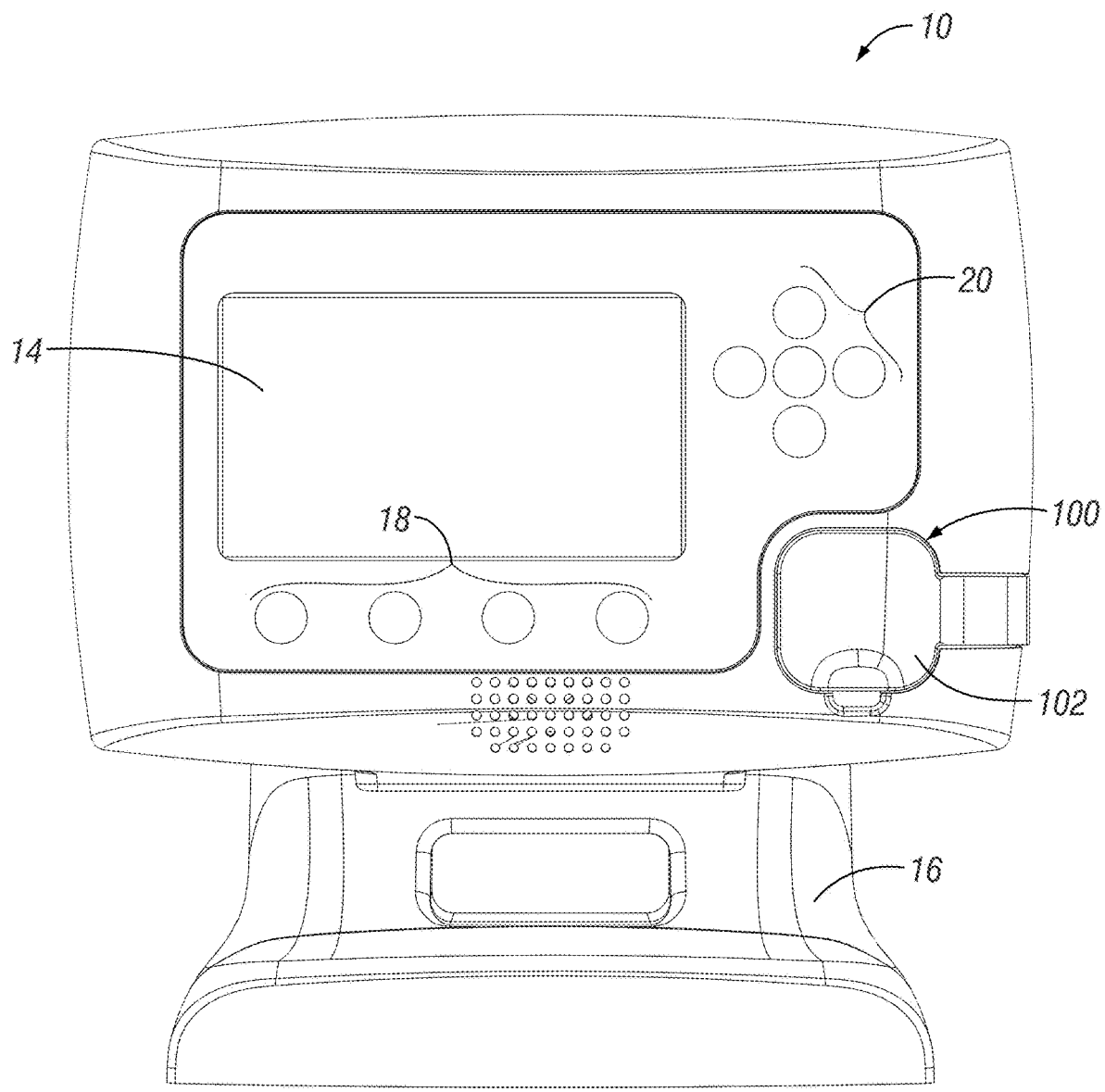
FIG. 2 is a front elevation view of the controller illustrated in FIG. 1.
Figure 3:
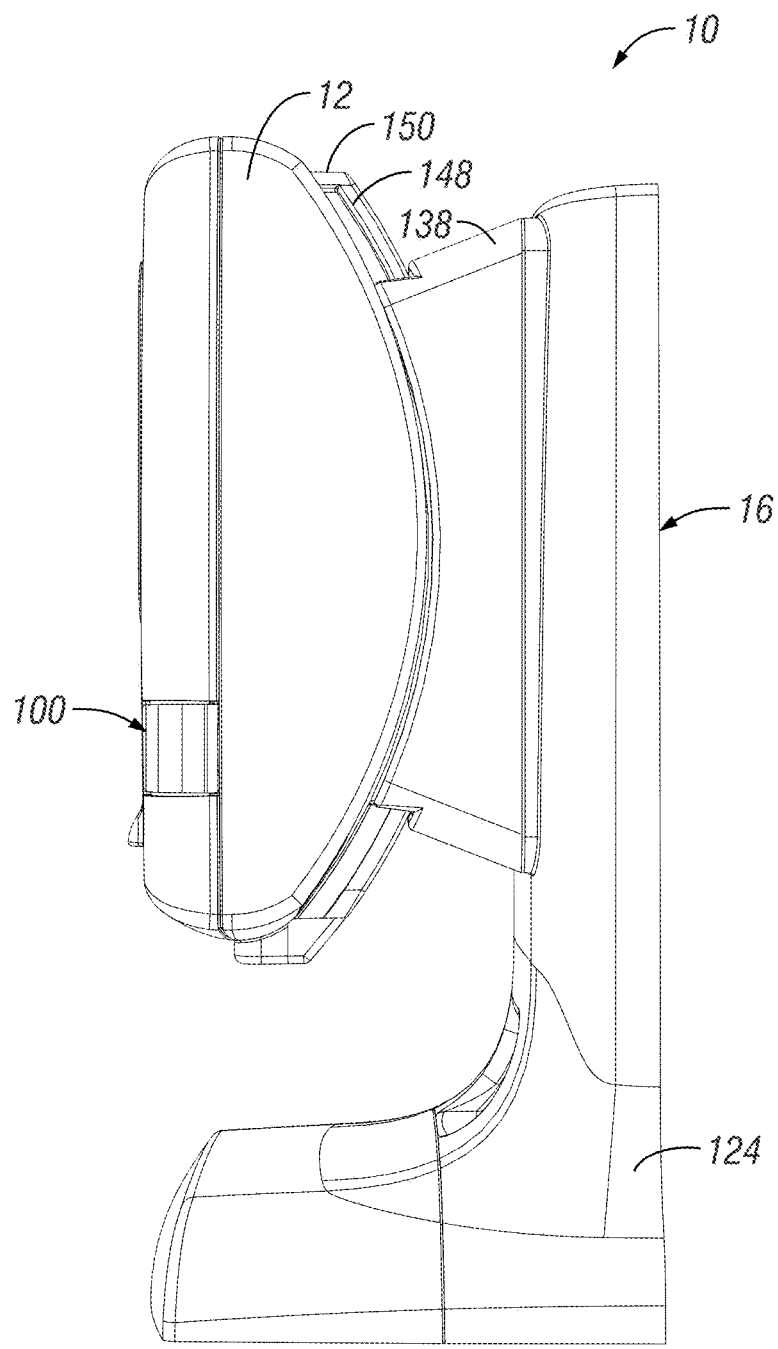
FIG. 3 is a side elevation view of the controller illustrated in FIG. 1.

FIGS. 1-3 illustrate the control device 10 of the present invention. The control device 10 includes generally a housing 12 having a display 14 and a mounting bracket assembly 16 mounting the controller housing 12 at a desired location such as adjacent or affixed to a utility device. The controller housing 12 also includes controls 18 and 20 for an operator or use to provide input or instructions to the control device 10. The controller housing 12 includes one or more openings in the enclosure housing 12 for making wired connections to the electronics within the controller housing 12. The openings, as described in further detail below, have features to prevent water, moisture, debris, and other degradational affects from the surrounding environment from injuring into the controller housing 12. The controller housing 12 also includes features for providing a sensory output for perception by an operator or user. These features include the display 14 providing a visual sensory output and a speaker 40 illustrated at FIG. 19 providing an audio sensory output for perception by the user or operator. Micro apertures within the controller housing 12 permit passage of audio from the speaker 40 to the environment where the control device 10 is installed for perception by an operator or user.

Figure 13:
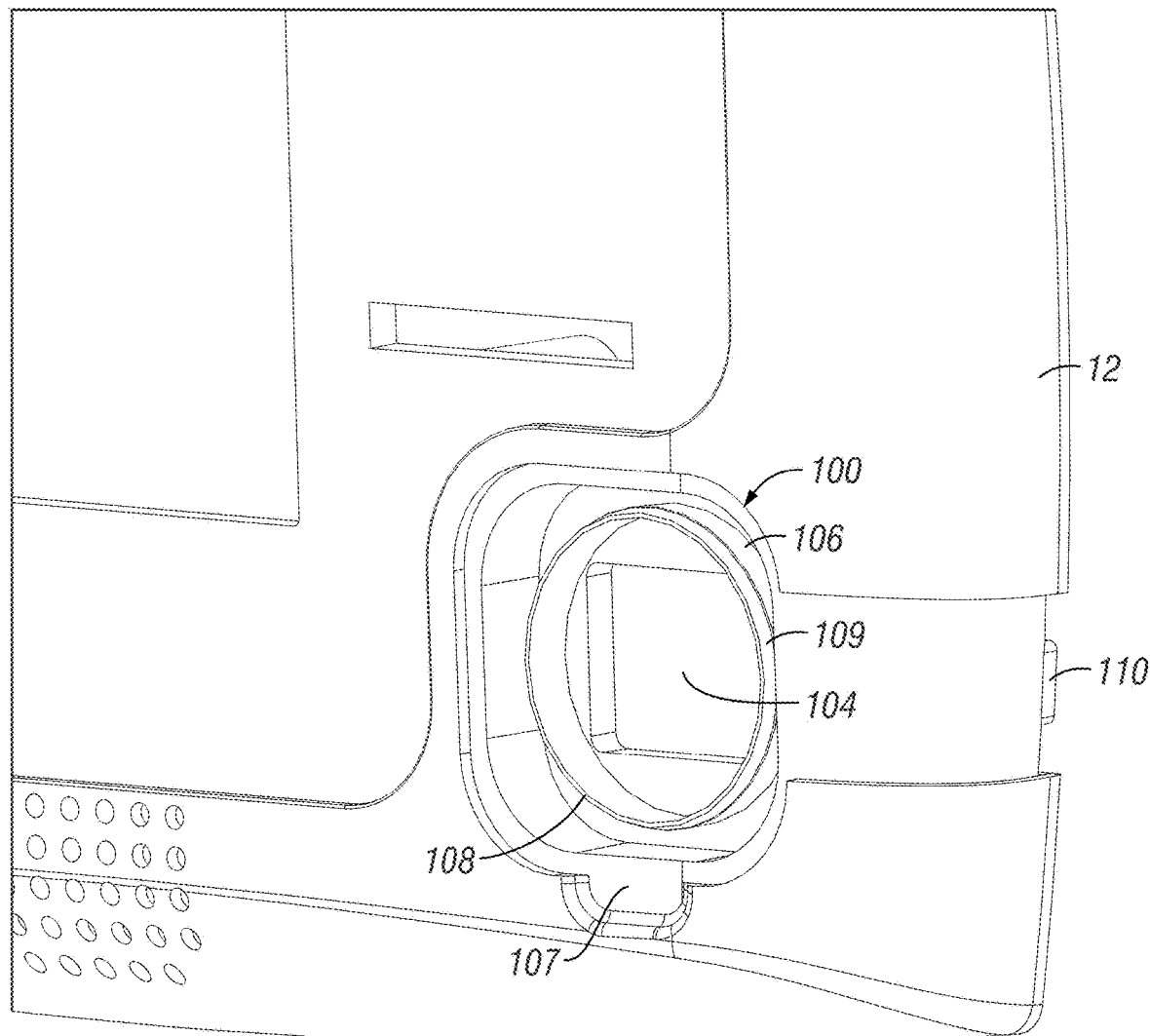
FIG. 13 illustrates a cable port into the controller housing illustrated in FIGS. 1-3.
Figure 14A:
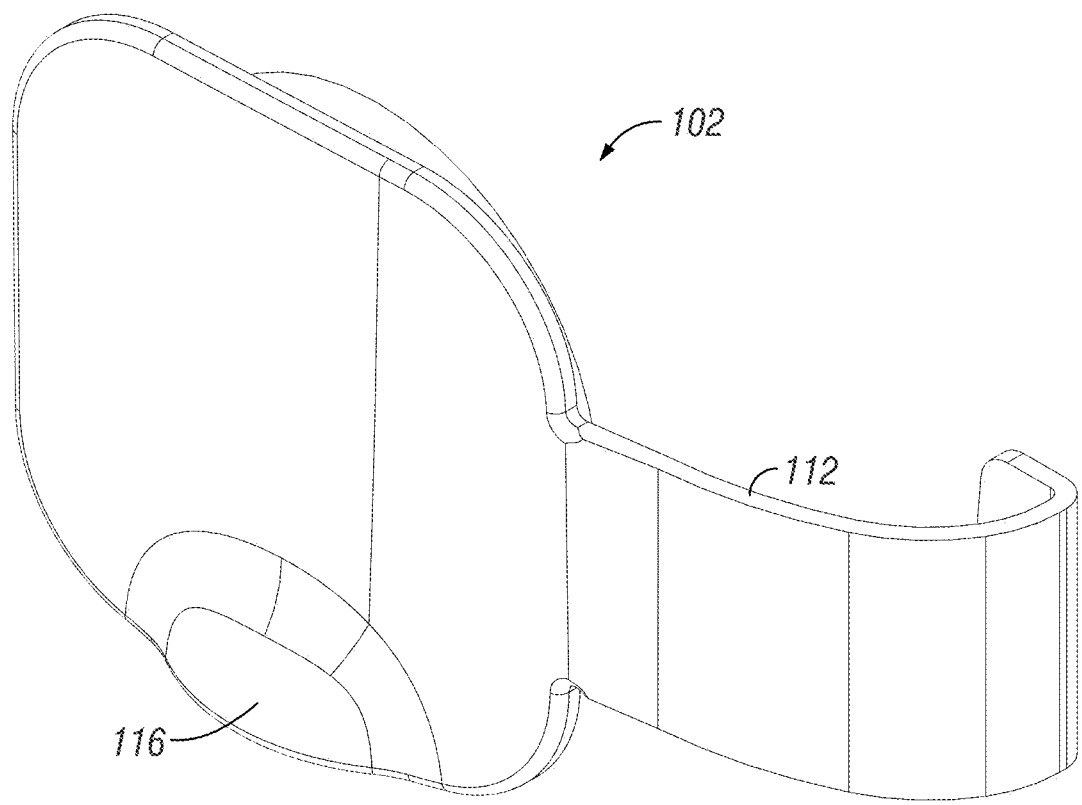
FIGS. 14A-B are perspective views of the front and back of the cap covering the cable port illustrated in FIGS. 1-3.
Figure 14B:
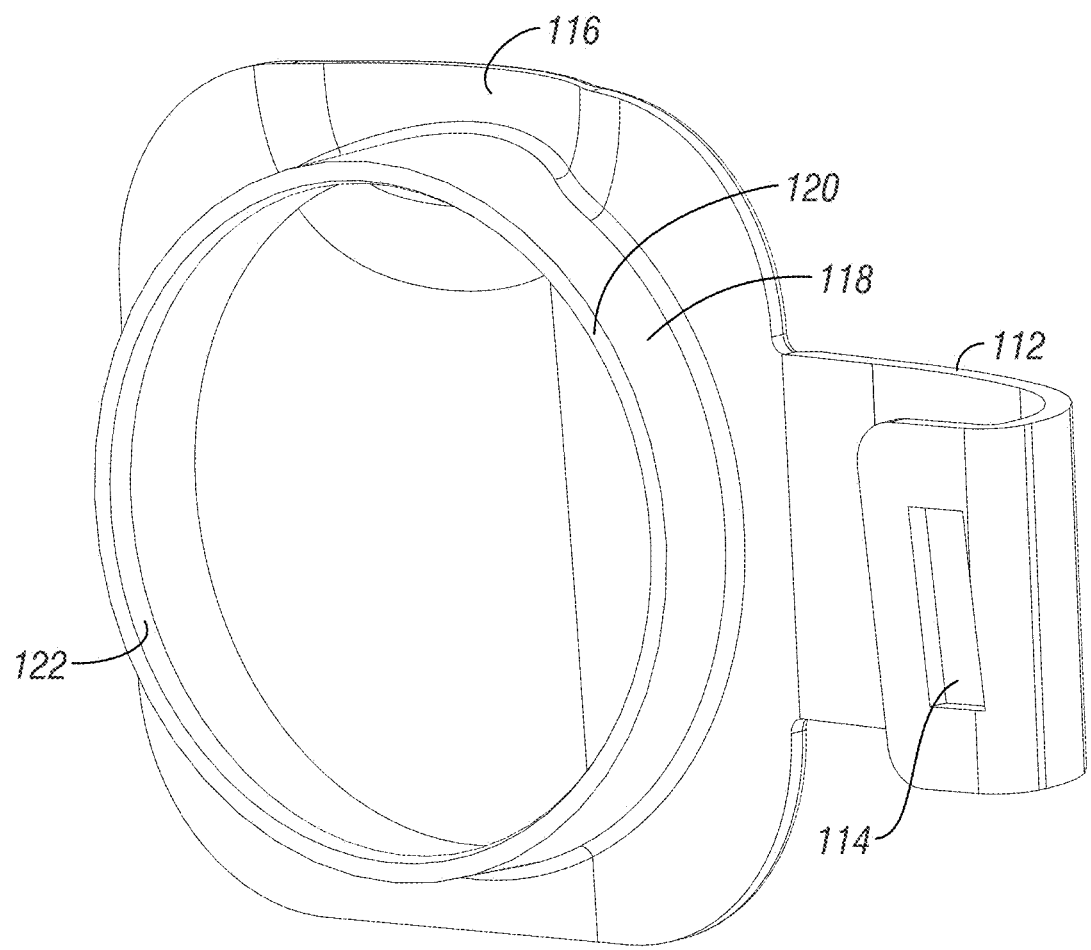

FIG. 1 also shows a cable port 100 and a cap 102, while FIG. 3 also shows the cable port 100, a mounting bracket 124, a coupling bracket 148, and guide stops 150. Details of the cable port 100 and the cap 102 are shown in FIGS. 13 and 14A-14B and are discussed in a following portion of the detailed description dedicated to FIGS. 13 and 14A-B. Details of the mounting bracket assembly 16 are shown in FIGS. 15-18 and are discussed in a following portion of the detailed description dedicated to FIGS. 15-18. More particularly, details of the mounting bracket 124 are shown in and discussed with FIGS. 15, 16A, and 18; details of the coupling bracket 138 are shown in and discussed with FIG. 16A-16B; and details of the guide rails 148 and guide stops 150 are shown in and discussed with FIG. 17.

Figure 4:
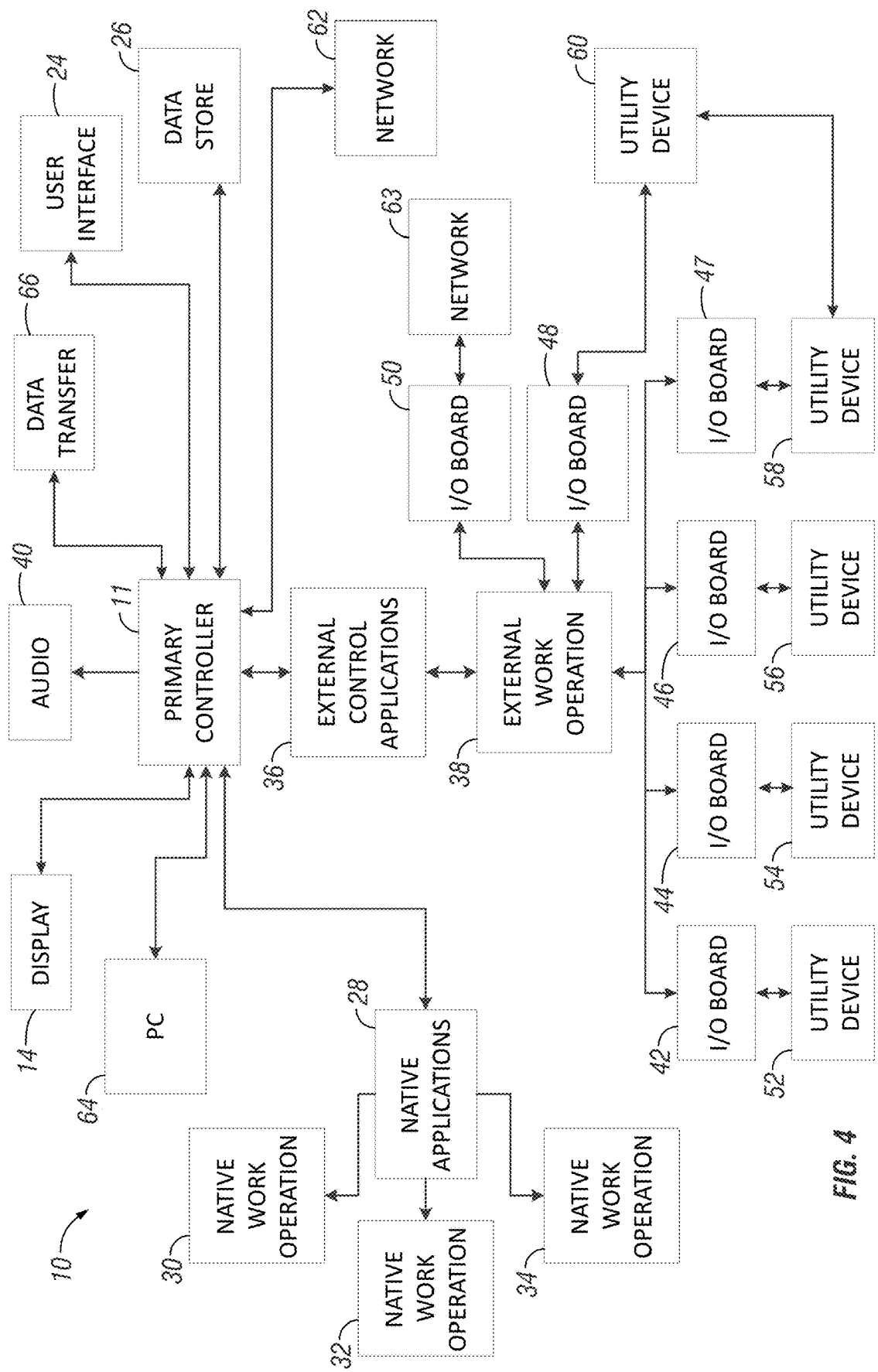
FIG. 4 is a block diagram illustrating control of the work operations of one or more utility devices.

FIG. 4 is a diagram illustration illustrating in greater detail the capabilities of the present invention for controlling multiple utility devices simultaneously and/or sequentially. As seen in the diagram representation illustrated at FIG. 4, the primary controller 11 which is operated using a multitasking operating system for controlling native applications 28 and the associated native work operations 30. The native applications 28 and the native work operations 30 may include performing operations stored as firmware or software to locally control and monitor various tasks associated with the primary controller 11. These tasks could include receiving and exporting data to PC 64, data store 26, user interface 24, data transfer 66, audio 40 and display 14 to name just a few. Other firmware or software may be loaded onto the primary controller 11 in the form of external control applications 36. The external control applications 36 may be limited to a utility device-specific set of controls or a bundle of utility device-specific controls. The controller, for example, could be removed from operating one application and installed on a new/different application, with the new software being downloaded onto the controller for controlling the new/different application. External control applications 36 loaded onto the primary controller 11 allow the primary controller 11 to have capabilities beyond the native applications 28 and native work operations 30. Running external control operations 36 on primary controller 11 entails access to the same native applications and work operations such as exchanging data information from PC 64, data store 26, user interface 24, data transfer 66, audio 40, network 62, and display 14. Generally, a set of external work operations 38 are associated with a specific type of device, such as a utility device. A set of utility device-specific external work operations 38 may be executed using input/output board for interfacing with each specific utility device. The input/output boards 42-48 interface with the utility devices 52-60 to execute external work operations 38. Multiple I/O boards may be used to execute external work operations 38 for a single utility device or multiple utility devices. Preferably, the I/O boards 42-50 include modules configured for use across a wide range of external control applications 36. Preferably, the modules use the same hardware and firmware for executing external work operations 38. Each I/O board 42-50 includes a microprocessor to control board function and for communication with the primary controller 11 or other applications such as the network 62 and/or 63 associated with the primary controller. The primary controller 11 may be manufactured with sections of the board left unpopulated for subsequent development and use in different external control applications 36. The present invention contemplates that utility devices 52-60 (i.e., for example, service industry utility devices) may include any device capable of operation or execution of a process, function or work operation. For example, the utility device may be a ware washing system, a laundry system (e.g., on-premise laundry controller), a pool and spa system, a chemical dispensing system (ware wash detergent dispensing, or on-site chemistry generation and dispensing), and/or a water conditioning system. Another system could include pest treatment, monitoring and elimination, vehicle care (e.g., vehicle care controller and dispensing system), food and beverage, and water/energy. Other systems include a diagnostics system, a sensor system, a network communication system, a system for monitoring operating parameters, a data storage system, a data transfer system, a compliance system, an auditing system, and other like systems. Examples of a system and method for managing, controlling and monitoring processes associated with a group of utility devices is disclosed in commonly owned application Ser. No. 10/348,512, filed Jan. 21, 2003 incorporated by reference herein. For example, one I/O board may be used to control a network 63 for connecting to a local area network (LAN), wide area network (WAN), or the Internet (IP). Data transfer over the network may also include cellular other modems allowing users to connect remotely to the primary controller 11. A single I/O board 48 may be used to control a utility device 60 interfacing with another utility device 58 as illustrated in FIG. 4.

There are numerous interfaces that could be used to connect the I/O boards 42-50 with the primary controller 11. For example, the primary controller 11 may be configured with USB ports. In other embodiments, RS-485 ports may be used as an interface. Ethernet, wireless devices and sensor networks (e.g., HHCM and HACCP) may also be used as a possible interface of the present invention. Universal Serial BUS (USB) and RS-485 are examples of serial buses standard to input/output board devices. Both are designed to allow peripherals to be connected using a single standardized interface socket and to prove the plug-and-play capabilities by allowing devices to be connected and disconnected without disassembling, or tearing down the existing system, even in the instance where external control applications are loaded onto the primary controller 11 where external control applications 36 are loaded onto the primary controller 11. In one exemplary aspect of this invention, a specific connector is used with the RS-485 interface bus associated with the controller and used with all utility devices (e.g., accessory equipment). For example, the connector may be a Mini-Fit Jr. from Molex Incorporated. The connector cables may include this receptacle. Preferably, there is a mating plug mounted on every circuit board using a bus that this receptacle plugs into. According to one aspect of the invention, the electrical interface of the receptacle includes, for example, pins 1 and 4 for a 24 Volt DC power supply, pin 3 for an RS-485 bus 'A' signal, pin 6 for an RS-485 bus 'B' signal, and pins 2 and 5 for an electrical ground. The 24V DC and electrical ground pins may be configured to supply power to all devices connected to the same bus. The RS-485 signal lines also may be configured to provide the communication link to all devices on the bus. All utility devices using the bus may include, for example, two of these connectors connected electrically in parallel so the bus can be "daisy chained" to multiple devices.

FIGS. 5-11 illustrate various diagrams representative of exemplary configurations for the primary controller 11 and various applications specific to I/O board configurations. FIG. 5 provides greater detail regarding a primary control board 68 for use in the primary controller 11 according to possible embodiments of the present invention.

The control board 68 includes a display 14. The display 14 may be a bitmap display, but is preferably a Quarter Video Graphics Array (QVGA) or higher resolution display. The control board 68 is powered by a logic-level power supply. A General Purpose Input/Output (GPIO) for providing additional digital control lines. The GPIO may include one or more diagnostic LEDs for identifying the programming loaded onto the board. The primary control board 68 also includes a primary control microprocessor module and a control system network communications module. A standard test access port and boundary-scan architecture such as a Joint Test Action Group (JTAG) for debugging and testing interfaces associated with primary control board 68. Primary control board 68 also includes a Field-Programmable Gate Array (FPGA) for implementing, for example, logic function onto the primary control board 68. An external ram and RS-485 ports may be included. The user interface 24 may include a key pad module. The key pads may be soft button key pad or another key pad module type. The user interface 24 may also include one or more hard-button controls such as controls 18 and 20 illustrated in FIGS. 1-3. A real-time clock and nonvolatile memory is also preferably included on the primary control board 68. A communications module is also provided that provides data transfer via Internet, Wi-Fi, USB, etc. as described above. A Multitasking Operating System (MOS) services the real-time application requests associated with the primary control board 68 or other applications. Other features of the primary control board 68 include a high performance clock speed, speaker alarm with volume control and ambient-noise compensated arm volume. As discussed above, the hardware and firmware design is preferably generally the same across the various types of utility devices and external work operations. Similarly, the firmware or primary control module may be modified based upon some desired external work operation for controlling one or more utility devices. In some instances, such as for certain utility devices or external work operations, features of the primary control board 68 may not be populated. For example, USB port may not be populated and a quick key pad may only be populated for certain utility device applications such as a dish machine application.

FIG. 6 provides a diagram for an input/output board for an On-Premise Laundry 70. According to possible embodiments of the present invention, the On-Premise Laundry (OPL) dispensing input/output board includes a relay output module preferably having multi-channel capabilities. The OPL board 70 also includes a microprocessor module and a control system networks communication module such as RS-485. A digital sensor input module, such as a float switch, I/R sensor multi-channel module is included. The OPL board 70 also includes a brushless motor control module such as a multi-channel module and a power supply. Generally, the hardware and firmware designed of the module 70 does not change between external control applications on the I/O ports 42-50. Preferably, the firmware on the control module on the I/O board 70 is application specific, such as specific to the external work operations for a certain utility device.

Figure 7:
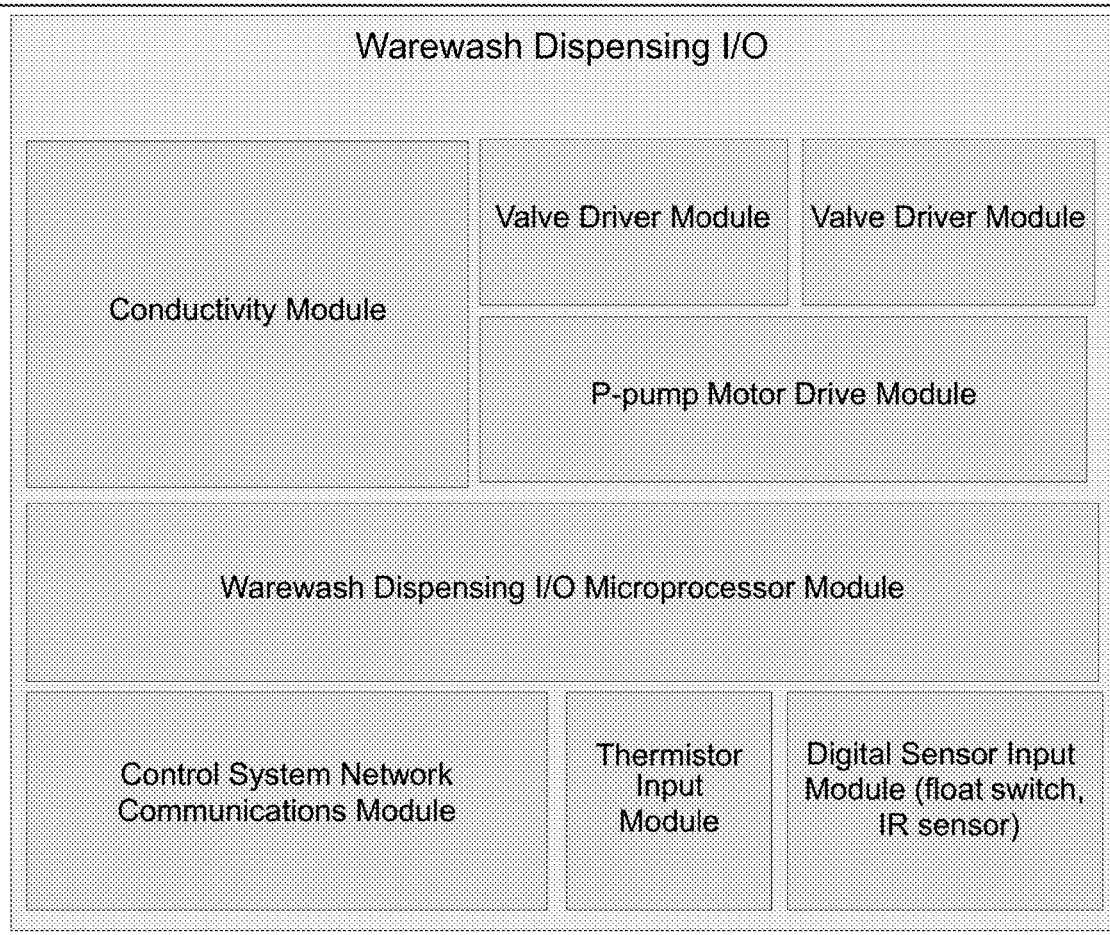
FIG. 7 illustrates an I/O board for a ware wash dispensing system in more detail in accordance with an embodiment of the present invention.

FIG. 7 illustrates an I/O board for a ware wash dispensing system 72. The board for ware wash dispensing includes a conductivity module, one or more valve drive modules, a P-pump (peristaltic pump) motor drive module, a ware wash dispensing I/O microprocessor module, and control system network communications module, a thermister input module, and a digital sensor input module such as a float switch or I/R sensor. As previously indicated, the hardware and firmware design for the ware wash dispensing I/O board module 72 does not change between the various external control applications 36 executed by the I/O ports 42-50. Preferably, the firmware of the control module on the I/O board is application specific.

Figure 8:
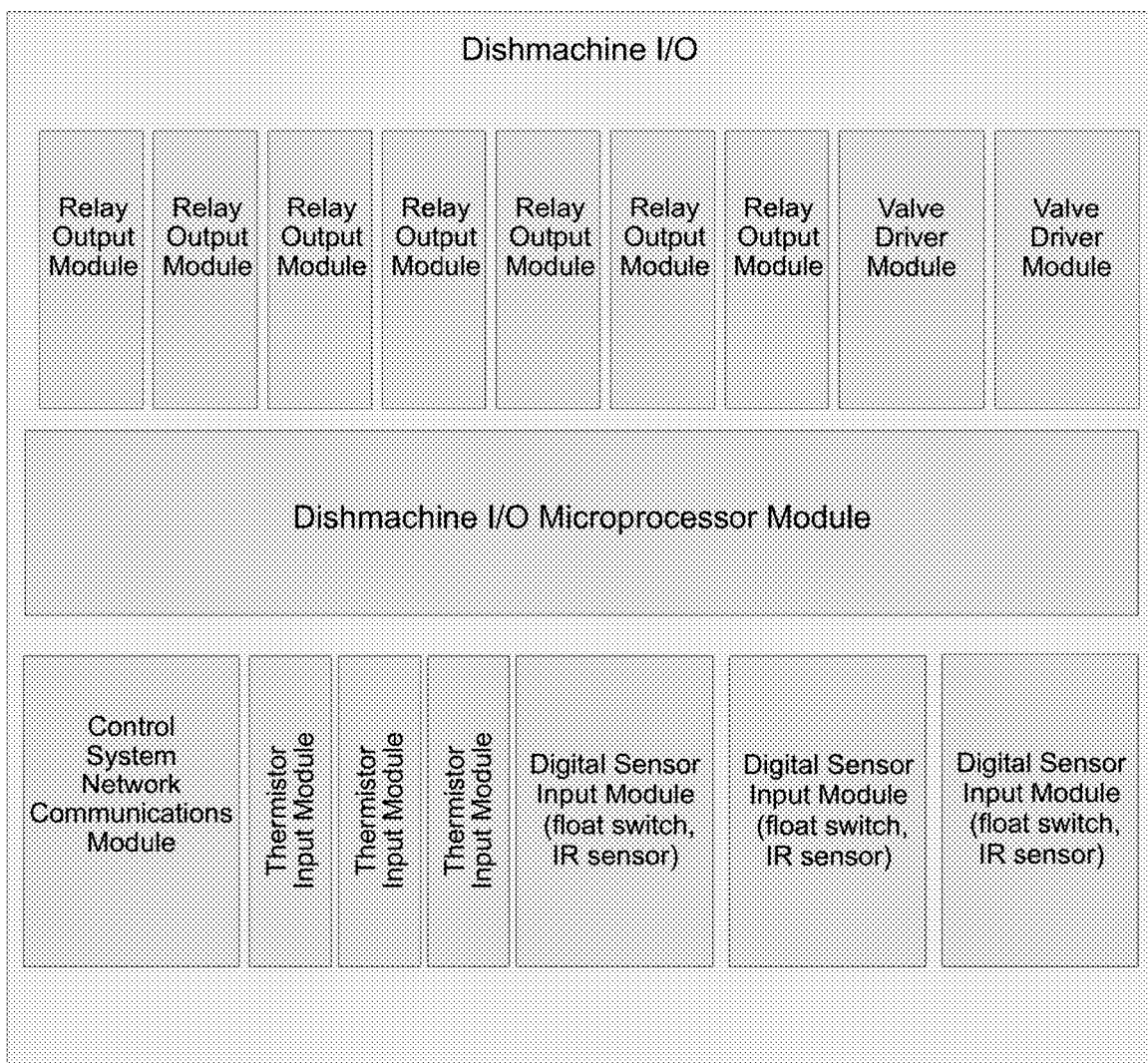
FIG. 8 illustrates an I/O board for a dish machine in more detail in accordance with an embodiment of the present invention.

FIG. 8 illustrates an I/O board for a dish machine 74. According to a possible embodiment of the present invention, the I/O board includes a plurality of relay output modules, one or more valve driver modules, a dish machine I/O microprocessor module, a control system network communications module, one or more thermister input modules, and one or more digital sensor input modules such as a float switch or I/R sensor.

Figure 9:
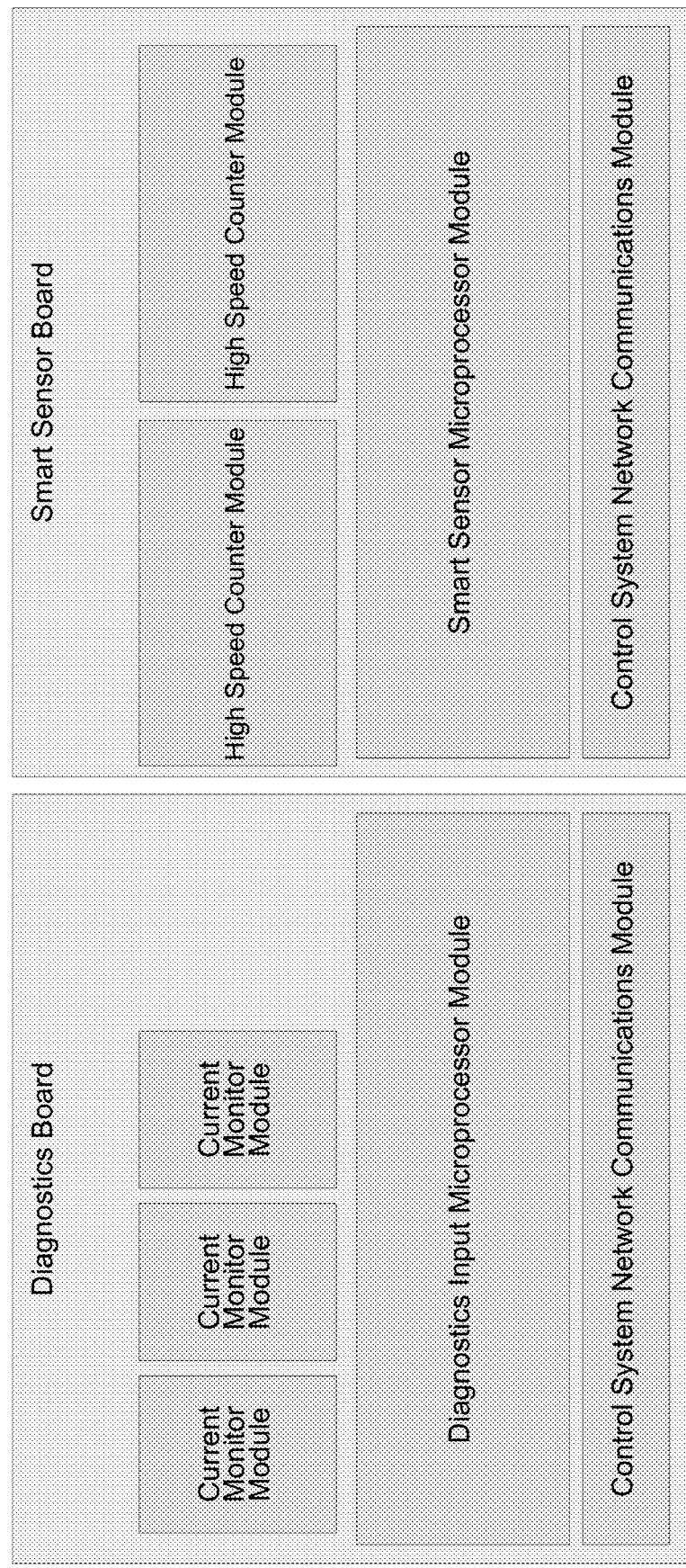
FIG. 9 illustrates an I/O board for diagnostics and smart sensor boards in more detail in accordance with an embodiment of the present invention.

FIG. 9 illustrates both diagnostics and smart sensor I/O boards 76 according to possible embodiments of the present invention. The diagnostic board includes a plurality of current monitor modules, a diagnostics input microprocessor module and a control system network communications module. The smart sensor board includes one or more high speed counter modules, a smart sensor microprocessor module, and a control system network communications module.

Figure 10:
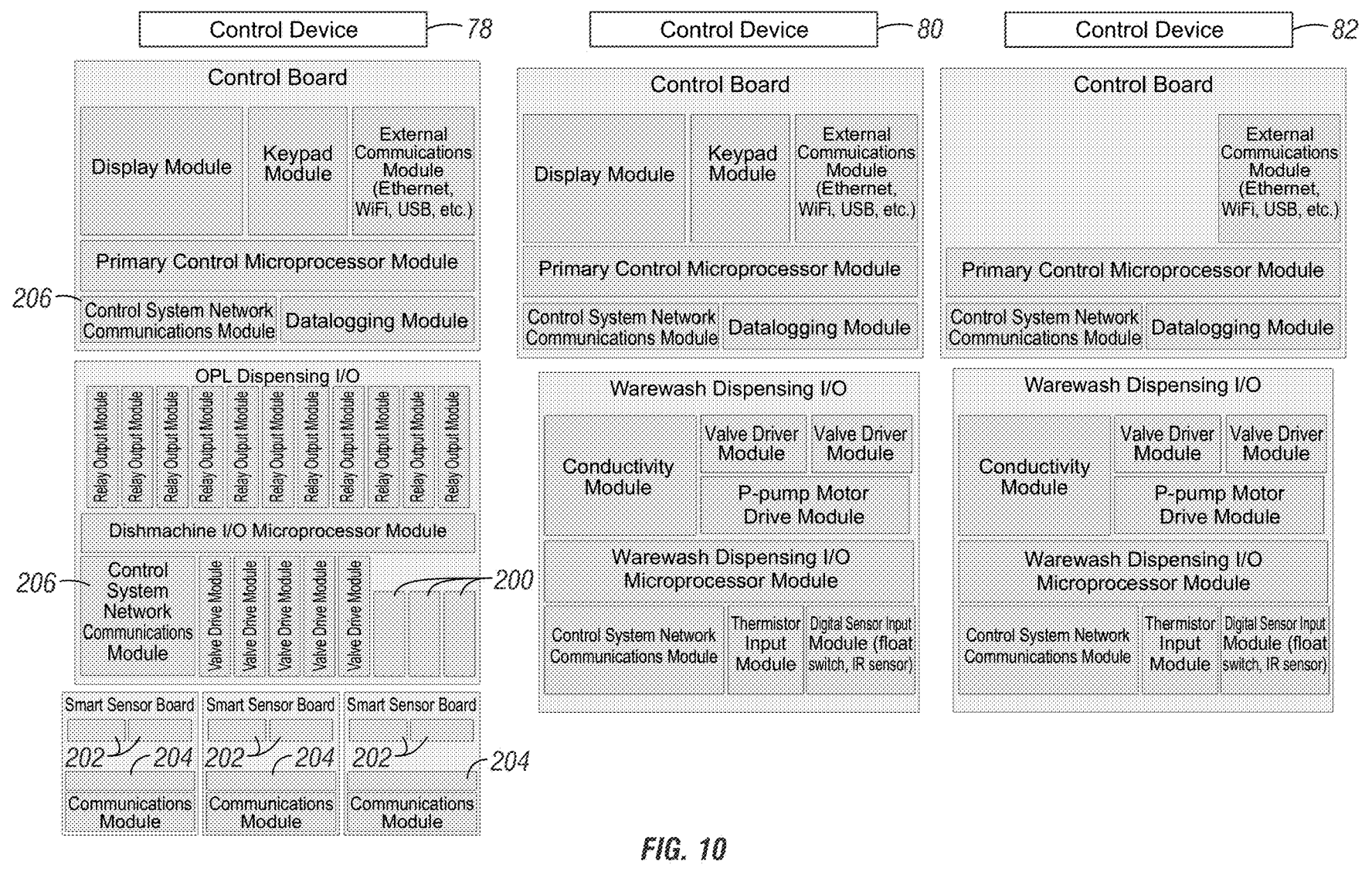
Figure 11:
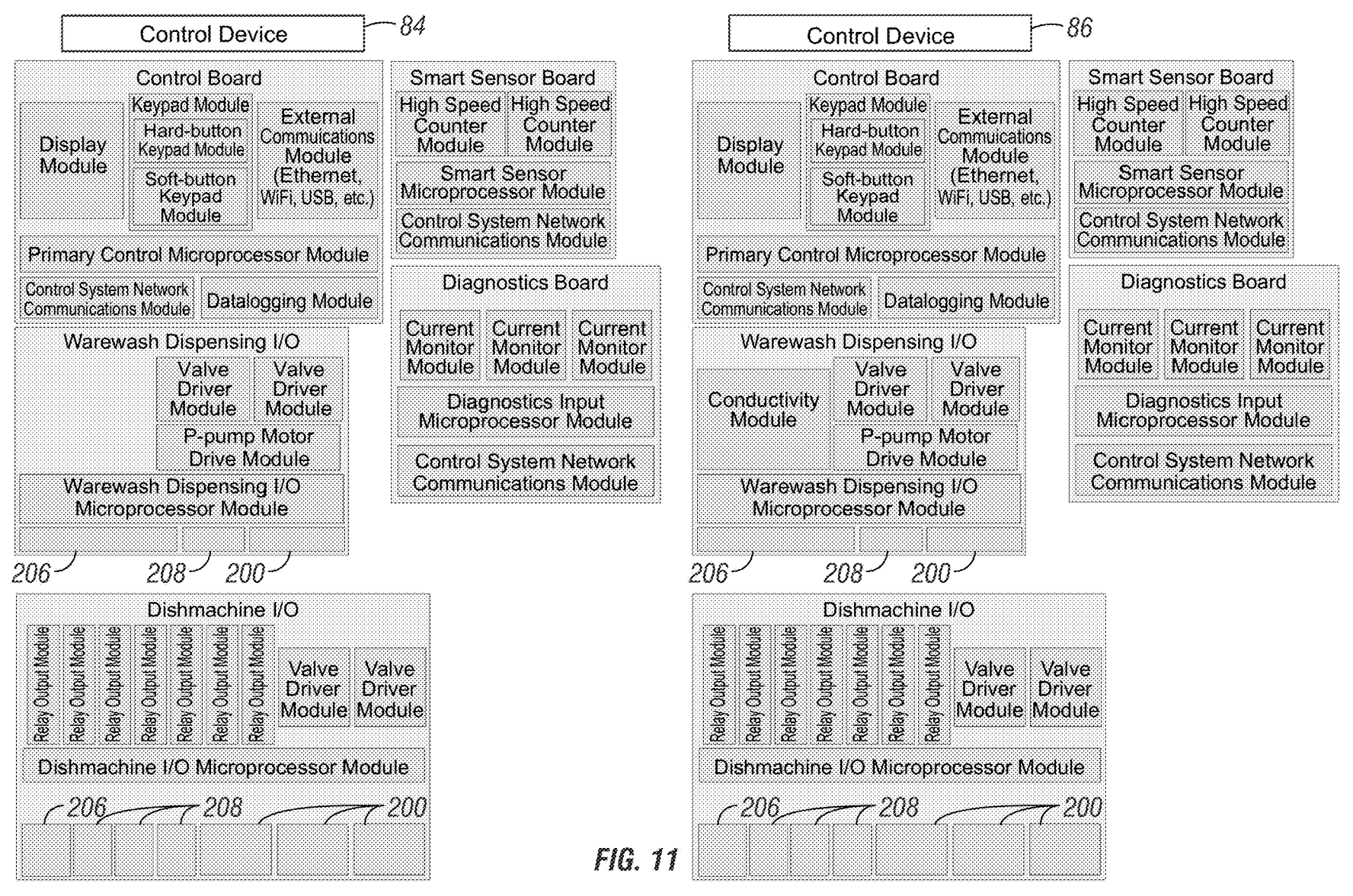

FIGS. 10-11 illustrate various control device configurations according to embodiments of the present invention. Specifically, FIG. 10 illustrates specific dish machine and ware wash control devices. In one control device 78, the control board includes a display module, a key pad module, external communications modules such as Internet, Wi-Fi, USB etc., primary control microprocessor module, a control system network communication module 206 and a data logging module. The on-premise laundry dispensing input/output board includes a plurality of relay output modules and a dish machine input/output microprocessor module. A control system network communications module and a plurality of valve driver modules and digital sensor input modules 200 such as a float switch or I/R sensor are also included on the OPL dispensing input/output board as discussed above. A smart sensor board may also be included having one or more high speed counter modules 202, a smart sensor microprocessor module control system network 204 and a communications module. Control device 80-86 provide additional possible embodiments of the present invention. For example, the control device may include modules in addition to those discussed above, such as a thermistor input module 208.

Figure 12A:
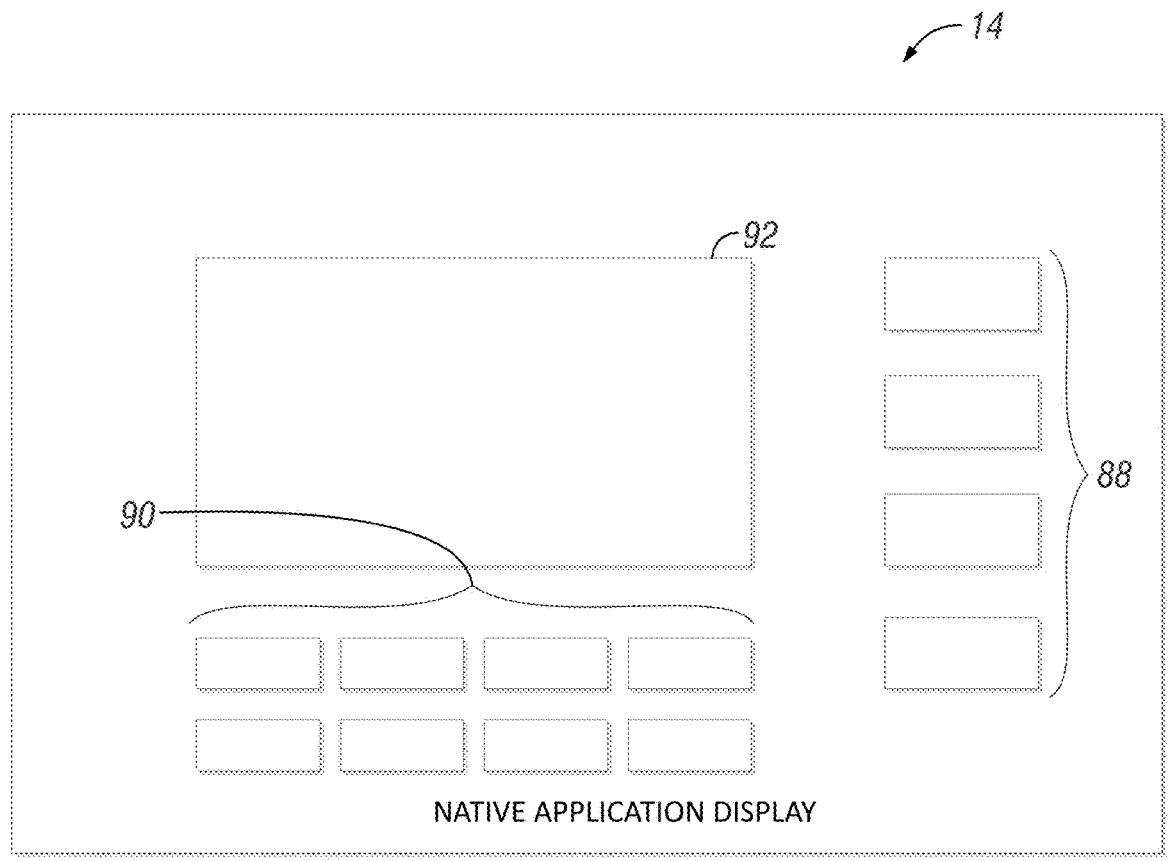
FIG. 12A is a screenshot illustrating exemplary device controls for one or more external operations of a utility device of the present invention.
Figure 12B:
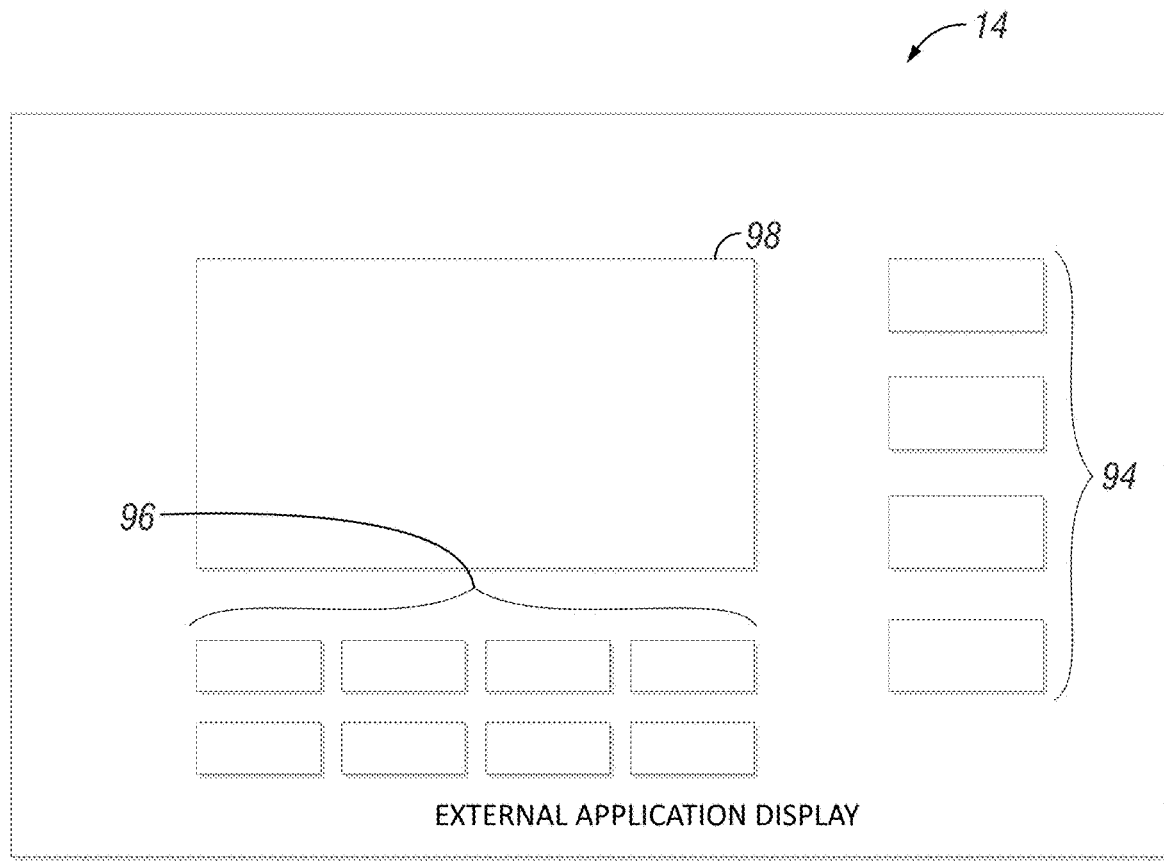
FIG. 12B illustrates another screenshot for device controls for controlling one or more work operations of a utility device of the present invention.

FIGS. 12A-B are diagrams illustrating the display 14. FIGS. 12A-B illustrate diagrammatically possible screenshots of the display 14. In one aspect of the present invention, the display 14 includes visual elements for providing user-perceived information, functions, processes, alarms, or other pertinent outputs for the user or operator. For example, the display may include native device controls 88, native work operations 90 and native applications 92 illustrated on the display 14. Native device controls 88 allow an operator or use to provide input to the controller, such as for example, via soft keys. Native work operations 90 provide information to the operator or user regarding the type of process being executed by the controller. Additionally, the native work operations controls 90 may also be an input control for selecting a native work operation for execution by the controller. Native applications 92 appear visually on the display 14. For example, native device controls 88 may include ability of the operator or user to select a nationality appropriate language. Other native controls 88 may include adjustments to the display 14 and audio 40 to name a few. Training and/or tutorial video, text, or audio may be shown on the display for educating or helping the operator or user to troubleshoot native applications on the controller. FIG. 12B illustrates diagrammatically another screenshot for the display 14. The display 14 includes external device controls 94, external work operations 96, and external applications 98 illustrated visually on the display 14. The external device controls 94 include one or more of a set of device controls associated with a specific utility device. The external device controls 94 may be soft keys so that the same keys control additional or other functionality and/or work operations associated with one or more other types of utility devices. The external work operations 96 may be input or output keys. The user or operator may select the type of work operation for execution by the I/O board interfacing with a specific utility device. Additionally, the external work operations 96 may be visually illustrated to provide troubleshooting options for device-specific external work operations. The external application 98 may be used to visually provide the user or operator with additional information such as training and/or tutorial videos, text for one or more external work operations associated with a utility device. Information such as training and tutorial information may be presented to the operator or user via the audio system 40 of the control device 10. According to one aspect of the invention, programming for one or more specific informational displays (e.g., screenshots) may be programmed in, for example, a programming screen. Tutorials and training may be generic to one or more applications, devices, appliances, etc. Alternatively, tutorials and training may be specific to each individual application, device, appliance, etc. Tutorials and/or training for each separate application, device, appliance, etc. may be loaded on separately with operation of each new or existing application, device, appliance, etc. For example, tutorials and/or training tools for a laundry services may be loaded on separately from tutorials and/or training tools for ware washing. Tutorials and training specific information may be downloaded when the system is first configured or expanded later. Tutorials and/or training may be available for display only for controllers that have been configured with certain parameters. For example, a controller may be configured to be used with a specific type of conveyor ware wash appliance or with a specific type of door-type ware wash appliance. When the controller indicates an alarm indicating that the wash tank of the ware wash appliance should be drained and refilled, the tutorial and/or training video displayed would be specific to the ware wash appliance that the controller is configured for.

FIGS. 13 and 14A-B illustrate a cable port in the housing 12 of the control device 10. The cable port 100 provides for wired or cable connections to be made with the electronics within the housing 12, such as cable connection to another electronic device such as a PC 64 (shown in FIG. 4). The cable connector or port may be an Ethernet port, RJ45 connector, or other like connector or port. The cable port 100 is covered by a cap 102 illustrated in FIGS. 1-2 and 14A-B. When the cable port 100 is not in use, the opening 104 of the cable port 100 is closed off by cap 102. A gasketless, water tight seal is formed between the cap 102 and the opening 104 to prevent water from entering into the housing 12 thereby causing damage to the electronics within the housing 12. According to one embodiment of the present invention, the opening 104 includes a wall 106 extending outwardly from the housing 12 and terminating in an edge 108, wherein the wall 106 can be a generally radially shaped wall. A rib extending generally perpendicularly outward from the wall 106 may be included at or near the edge 108. The rib 109 is preferably elastically deformable. Additionally, the wall 106 has a minimum wall thickness to allow deformation of the wall 106 housing the rib 109. A recess 107 is included about the opening having a depth and angle suitable for inserting a finger of an operator or user's hand to disengage the cap 102 from the cable port 100. The housing 12 includes a post 110 received within aperture 114 in the tether portion 112 of the cap 102 illustrated in FIG. 14B. Also, as illustrated in FIGS. 14A-B, the cap 102 includes a flange which is generally radially shaped that extends outward a distance and terminates in edge 120. A rib 122 extends generally perpendicularly inward from the flange at or near the edge 120. The flange 118 has a minimal thickness so as to be elastically deformable. Similarly, the rib is constructed of an elastically deformable material. The cap 102 also includes a flared portion 116 cooperating with the recess 107 illustrated in FIG. 13 to provide a gap for insertion of a finger for separating the cap 102 from the cable port 100. The relative diameters of the wall 106 and flange 118 are different from one another only enough to cause an interference fit between the flange 118 on the cap 102 and the wall 106 extending from the opening 104 of the cable port 100. The elastically deformable rib 109 and 122 create a water tight seal to prevent water from entering into the housing 12. The ribs 109 and 122 also prevent the cap 102 from inadvertently becoming separated from the cable port 100. The present invention contemplates that the rib 109 and 122 may be included on internal or external surfaces of the wall 106 and flange 118. Additionally, one or both ribs may be removed in the case where the interference fit between the wall 106 and the flange 118 is sufficient tight to provide a water tight seal yet sufficiently elastically deformable to allow the cap 102 to close the cable port opening 104. The present invention contemplates other possible embodiments of a cap for a cable port in the housing 12. According to one aspect of the present invention, the cap 102 may be constructed to include an inner sealing surface having a cable seat for sealing against an outer surface of a cable plugged into the electronics in the housing 12 for sealing the housing 12 against water ingressing around the cable when the cable port 100 is closed by the cap 102. Embodiments of the cap include an aperture having the sealing surface for seating against the cable passing through the cap 102. For example, the cap 102 may be constructed as a two-piece unit whereby the cable passes through an aperture in one or partially in both of the two pieces of the cap and is sealed by the sealing surfaces of the cable seat so that the cable can be plugged into the electronics and the cable port 100 capped off by the cap 102 at the same time.

Figure 15:
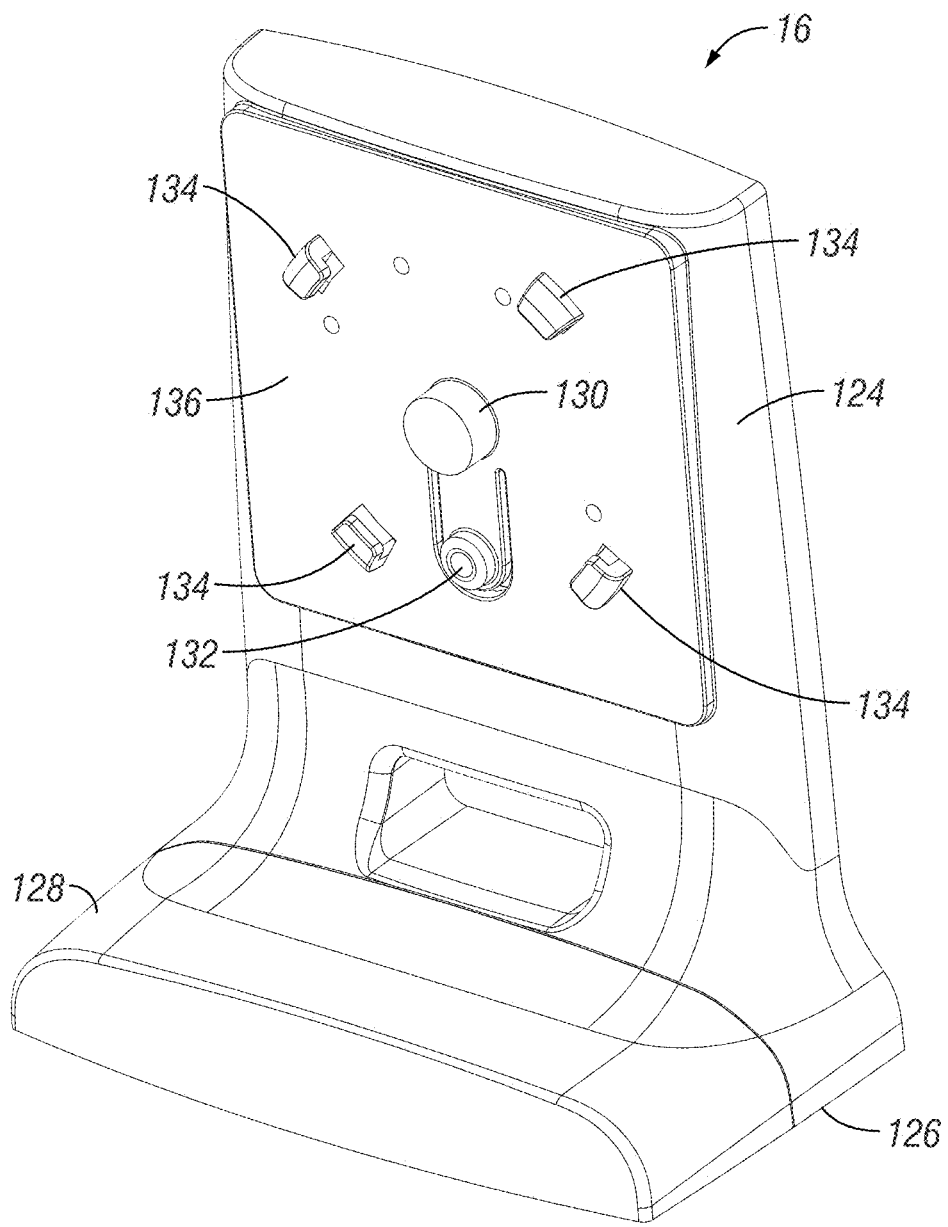
FIG. 15 illustrates one bracket of the mounting bracket assembly for the electronics enclosure illustrated in FIGS. 1-3.
Figure 16A:
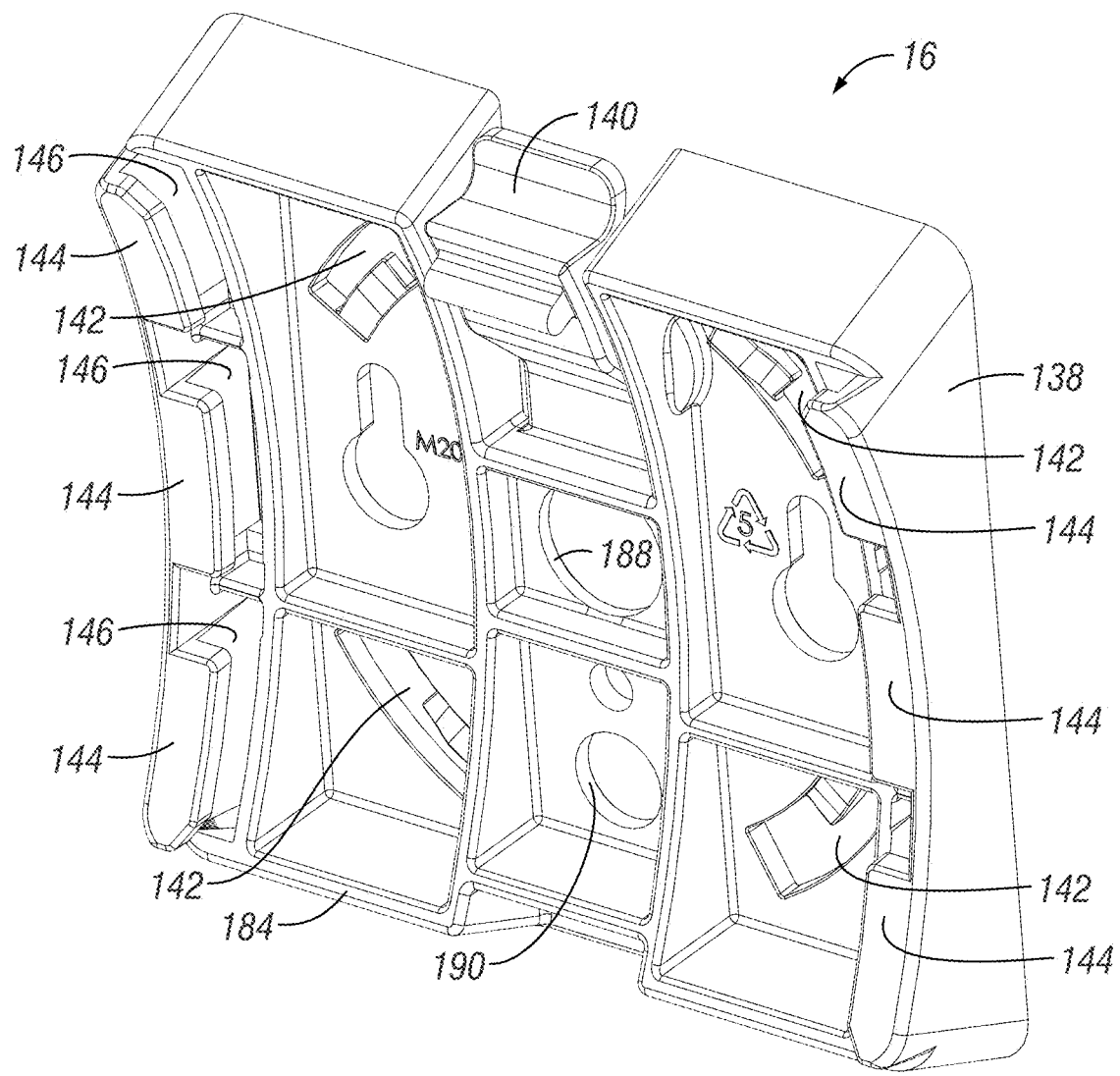
FIGS. 16A-B are front and back side perspective views of a coupling bracket of the mounting bracket assembly for the electronics enclosure illustrated in FIGS. 1-3.
Figure 16B:
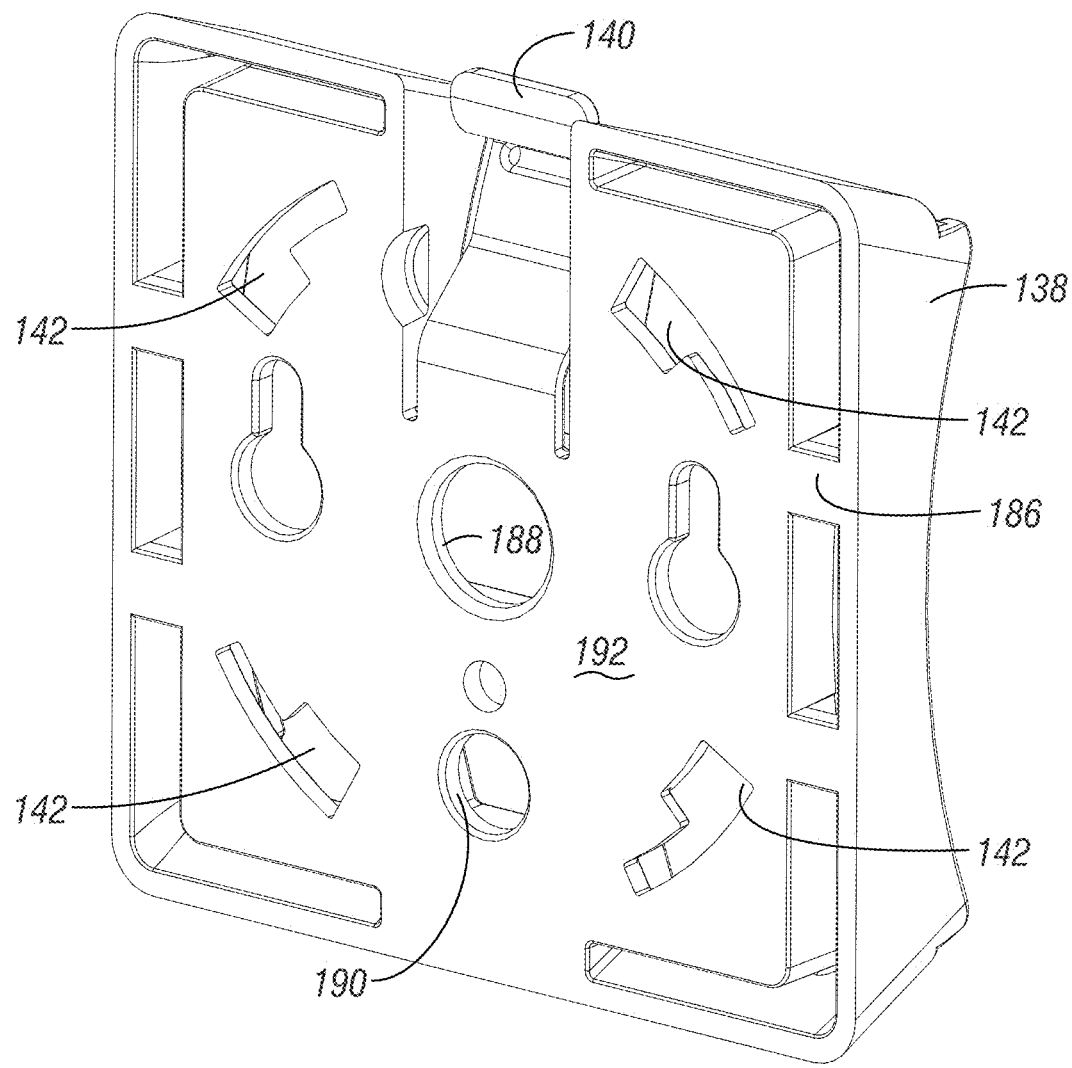
Figure 17:
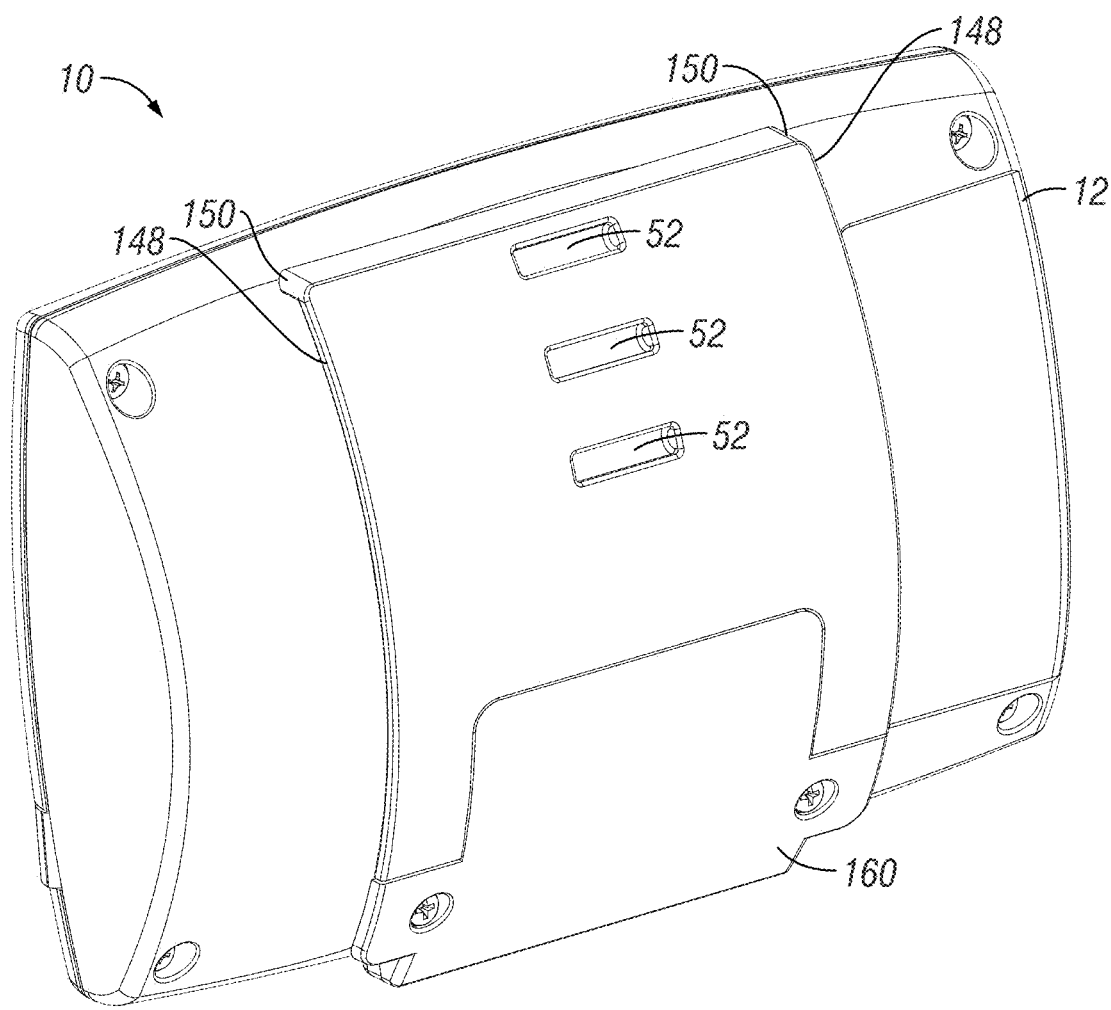
FIG. 17 is a perspective view of the controller housing according to one embodiment of the present invention.
Figure 18:
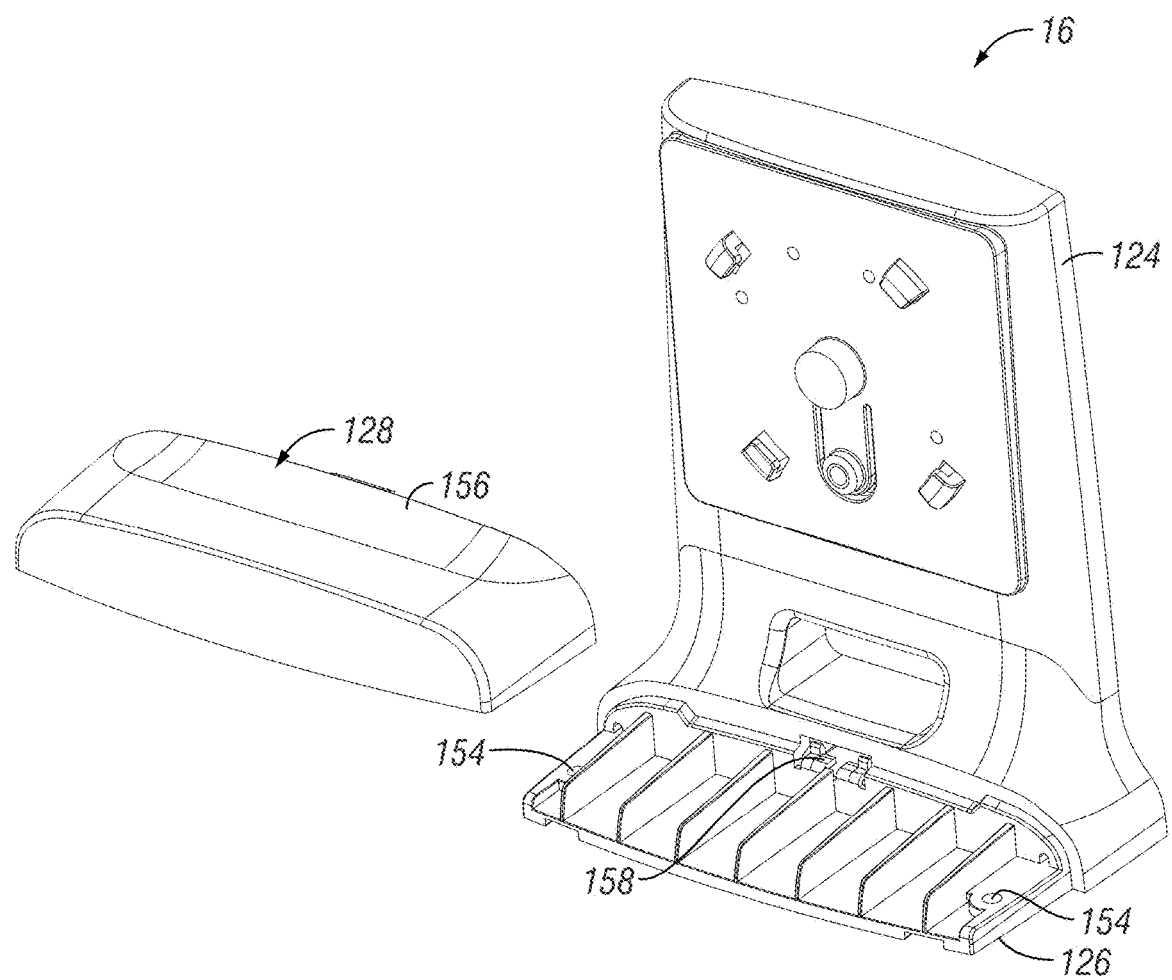
FIG. 18 is a perspective view of a removal cover for a bracket of the mounting bracket assembly illustrated in FIG. 15.

FIGS. 15-18 illustrate a mounting bracket assembly 16 according to an exemplary embodiment of the present invention. More particularly, FIG. 15 shows the mounting bracket assembly 16, a mounting bracket 124, a mounting plate 126, a cover plate 128, an alignment pin 130, a detent 132, a plurality of keys 134, and a mounting face 136. FIG. 16 shows the mounting bracket assembly 16, a coupling bracket 138, a bias tab 140, radially spaced keyways 142, tracks 144, slots 146, a front side 184, an aperture 188, and an aperture 190. FIG. 16B shows the mounting face 136, the bias tab 140, the radially shaped keyways 142, a back side 186, the aperture 188, the aperture 190, and a mounting face 192. FIG. 17 shows the control device 10, the housing 12, guide rails 148, guide stops 150, slots 152, and a cover 160. FIG. 18 shows the mounting bracket assembly 16, the mounting bracket 124, the mounting plate 126, the cover plate 128, mounting features 154, a tab 156, and a slot 158. A more detailed discussion of how each of the components of the mounting bracket assembly 16 interact with one another follows.

The mounting bracket assembly 16 includes a mounting bracket 124 having a mounting plate 126 covered generally by cover plate 128. Mounting features 154 are included in the mounting plate 126 for affixing the mounting bracket 124 at a desired location such as to a utility device or an adjacent structure, wall or location nearby. A mounting plate 126 of the mounting bracket 124 includes a cover plate 128 having a tab 156 received within a slot 158 to prevent inadvertent or unintentional separation of the cover plate 128 from the mounting plate 126. The cover plate 128 covers and seals the mounting features 154 used to affix the mounting plate 126 to a desired installation location. The cover plate 128 helps prevent debris and moisture from degrading, eroding and destroying the means for mounting the mounting bracket at a desired location. For example, the cover plate 128 protects a screw, rivet, Velcro, double-sided adhesive, or other attachment means used to secure the mounting plate 126 at the desired install location. Cover plate 128 also provides an esthetic and ornamental appeal to the mounting bracket 124. The mounting bracket 124 is generally oriented perpendicularly relative to the mounting plate 126 as illustrated in FIG. 15. The present invention contemplates that the mounting bracket 124 may be oriented at any angle relative to the mounting plate 126. The mounting bracket 124 includes a mounting face 136, a generally planar surface. An alignment pin 130 extends outwardly from the mounting face 136. A plurality of keys 134 are spaced generally radially about the alignment pin 130. A detent 132 is also provided in the mounting face 136 and is biased outward from the mounting face 136.

The mounting bracket assembly 16 also includes a coupling bracket 138 illustrated in FIG. 16A. The coupling bracket 138 includes a front side 184 illustrated in FIG. 16A and a back side 186 illustrated in FIG. 16B. As best illustrated in FIG. 16B, the back side 186 of the coupling bracket 138 includes a mounting face 192 which is generally planar. The mounting face 192 mates against the mounting face 136 of the mounting bracket when the two are coupled together. Additionally, the coupling bracket 138 includes an aperture 188 for receiving the alignment pin 130 on the mounting bracket 124 when the two brackets are coupled together. Similarly, the aperture 190 and the coupling bracket 138 receive the detent 132 on the mounting bracket 124 when the two are coupled together. The detent 132 is biased outward so as to force the detent into the aperture 190 when the two are properly aligned. As best illustrated in FIG. 16B, the coupling bracket 138 also includes a plurality of key ways 142 spaced radially about the aperture 188. The radially spaced key ways 142 have the same mounting pattern as the radially spaced keys 134 on the mounting face 136 of the mounting bracket 124. The coupling bracket 138 and mounting bracket 124 are connected together by aligning the alignment pin 130 with the aperture 188 in the coupling bracket so that the radially spaced keys 134 are received through the radially spaced key ways 142. The coupling bracket 138 is rotated until the outwardly biased detent 132 is received into the aperture 190 and the couple bracket 138. At this point, the radially spaced keys 134 are locked into the key ways 142 to secure the coupling bracket 138 to the mounting bracket 124. To separate the brackets, the detent 132 is depressed and the coupling bracket 138 is rotated the opposite direction to remove the interlocking function of the radially spaced keys 134 and the key ways 142.

As illustrated in FIG. 16A, the front side 184 of the coupling bracket 138 includes tracks 144 defining slots 146. The track 144 may be a continuous track or comprised on non-continuous sections illustrated in FIG. 16A. A bias tab 140 is included on the coupling bracket 138. The tab 140 is biased toward the front side 184 of the coupling bracket 138 is adapted for attachment to the housing 12 of the control device 10. The back side of the housing 12 includes a pair of guide rails 148 spaced apart the distance between the slots 146 and opposing tracks 144 on the coupling bracket 138. The guide rails 148 are open at one end and closed at the other. For example, as illustrated with the cover 160 shown in FIG. 17, guide stops 150 are included at the uppermost end of the paid of guide rails 148. Also included in the back side of the housing 12 are a plurality of slots 152 spaced apart to define degrees of rotation for the housing 12 relative to the coupling bracket 138. The housing 12 and coupling bracket 138 are connected by inserting the pair of guide rails 148 into the pair of opposing slots 146 in the tracks 144 of the coupling bracket 138. In a preferred form of the present invention, the pair of tracks 144 and pair of guide rails 148 are curved following the contour of the housing 12 for the control device 10. The curved or arcuate shape of the tracks 144 and guide rails 148 allow the orientation of the housing 12 relative to the coupling bracket 138 to be adjusted. Adjustments in the orientation of the housing 12 relative the coupling bracket 138 are accomplished by pivoting the housing 12 upward or downward. The bias tab 140 engages the slots 152 in the back side of the housing 12. To adjust the orientation of the housing 12 relative to the coupling bracket 138, the bias tab 140 is disengaged from a slot 152 and the housing 12 is orientated upward or downward depending on the desired orientation of the face, display 14 or user interface 24 of the control device 10. The distance between the slots 152 may be adjusted to control the degree of change and orientation of the housing 12 between each slot 52. For example, the slots 152 may be spaced closer together to provide incremental control of the orientation of the housing 12 relative to the coupling bracket 138. Alternatively, the slots may be spaced further apart so that the amount of orientation adjustment between slots is greater. The position of the slots 152 on the back side of the housing 12 for the control device 10 may be spaced a distance that translates into degrees of orientation adjustment to the face of the control device 10. For example, the slots 152 may be spaced apart so that the amount of orientation adjustment between slots is 5, 10, 15° or some other preferred degree of adjustment. The guide stops 150 at the top of the pair of guide rails 148 on the housing 12 prevent the housing 12 from inadvertently or accidentally separating from the coupling bracket 138 if the bias tab 140 becomes separated from the uppermost slot 152 or the housing 12 is adjusted past the uppermost slot 152 during an orientation adjustment of the housing 12. The mounting bracket assembly 16 is configured so that it can be mounted vertically or horizontally, such as on the top side or bottom of a utility device or an adjacent install location. To mount the bracket 16 horizontally, the coupling bracket 138 is separated from the mounting bracket 124 and rotated 90° and then reattached. The housing 12 is now oriented generally perpendicular to the mounting bracket 124. Additionally, to mount the bracket 16 on the bottom side of a utility device or upside down, the coupling bracket 138 is separated from the mounting bracket 124 and rotated another 90° and reattached. The mounting bracket 124 is now situated vertically above the housing 12 when installed. The mounting bracket assembly 16 allows the controller housing to be mounted on any surface of varying orientation. For example the controller housing may be mounted on the top, bottom or side of a utility device or other point of installation. Regardless of the installation position of the bracket assembly 16, controller housing 12 can be rotated and/or oriented so that the face and display of the controller are easily viewable by the operator or user using the adjustment features of the bracket assembly described above. Other aspects of the cover 160 are shown in and discussed with FIG. 20 in a following portion of the detailed description.

The mounting bracket assembly 16 includes generally a mounting bracket 124 and coupling bracket 138, and is mounted at the installation location using the mounting bracket 124 as described in detail above. The controller housing 12 may also be mounted at an installation location, such as to a utility device or adjacent wall, using only the coupling bracket 124 instead of both the coupling and mounting brackets 138 and 124. The coupling bracket 138 may be mounted to at an installation location using various attachments means, such as adhesive, Velcro, screws, nails, tape, etc. The controller housing can still be tilted/oriented relative to the mounted coupling bracket 138 using the methods described above.

Tilting option for the housing 12 remains operable regardless of mounting location or if mounted only by the coupling bracket.

Figure 19:
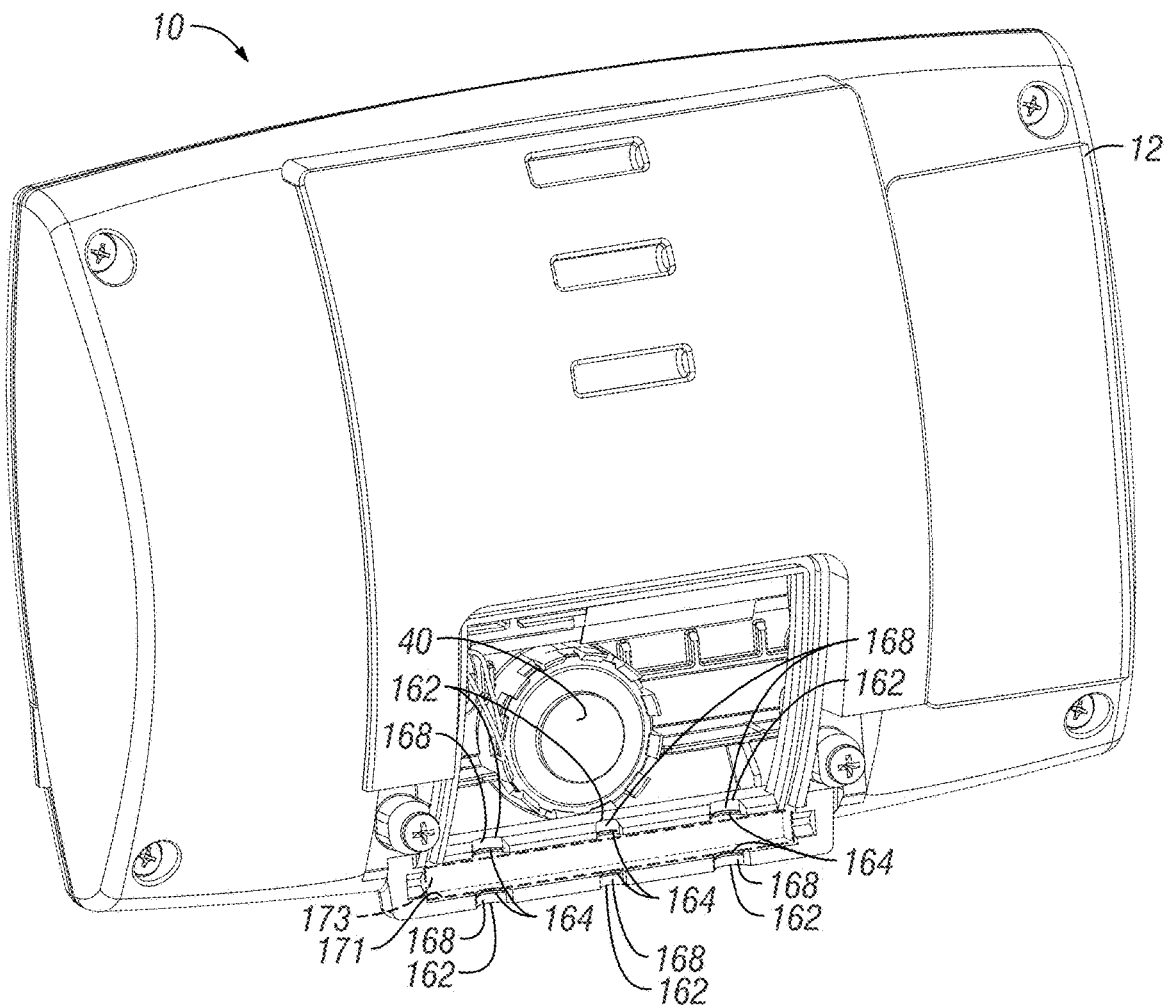
FIG. 19 is a perspective view of the back side of the controller housing with the cover shown in FIG. 20 hidden from view.
Figure 20:
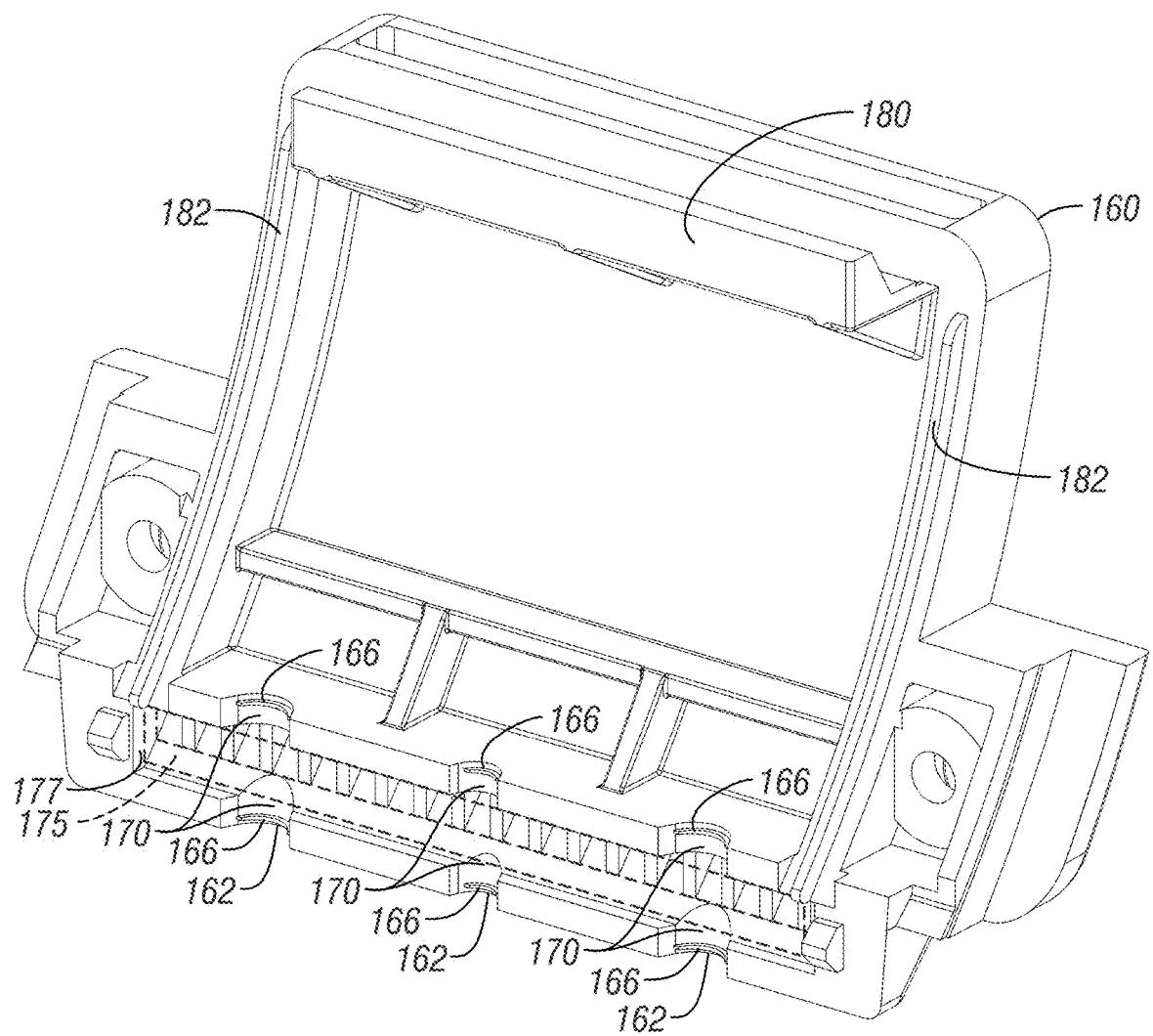
FIG. 20 is a perspective view of a cover for cable ingressing locations in the controller housing according to one embodiment of the present invention.

FIGS. 19-20 illustrate cable ports 162 passing through the housing 12 of control device 10. More particularly, FIG. 19 shows the control device 10, the housing 12, the speaker 40, cable ports 162, tabs 164, pockets 168, a space 171, and a gasket 173. FIG. 20 shows the cover 160, the cable ports 162, tabs 166, pockets 170, a similar gasket 175, a space 177, a flange 180, and seal ribs 182. A more detailed discussion of how each of these components interact with one another follows.

The cable ports 162 provide openings for a cable to pass through the housing 12 for connection within the enclosure 12. Cables are passed through the cable ports 162 by removing the cover 160 illustrated in FIGS. 17 and 20. The cable ports 162 provide a dual functionality, specifically the cable ports 162 have means for providing strain relief and sealing against the cable to prevent moisture from entering into the housing 12. According to one possible embodiment of the present invention, the cable ports 162 include tabs 164 in the housing 12 and opposing tabs 166 in the cover 160. The tabs include a leading non-deformable edge for engaging an outer surface of a cable passing through the cable ports 162. Additionally, the cable ports include a pocket 168 in the housing 12 and opposing pockets in the cover 160. The pockets 168 and 170 engage the outer surface of the cable passing through the cable ports 162 to seal against the cable and prevent moisture from entering through the cable ports 162 into the housing 12. The space 171 between the pair of pockets 168 on the housing 12 may also include a gasket 173, such as a foam seal, to seal against the cable and prevent moisture from entering through the cable ports 162 into the housing. A similar gasket 175 may also be included in the space 177 between the pair of pockets 170 on the cover 160. The pockets 168 and 170 may include a leading deformable edge for engaging in sealing against the outer surface of the cable passing through each cable port 162. Additionally, the present invention contemplates that the outermost cable port 162 may be used to seal against the outer surface of the cable to prevent water from entering into the housing 12 and the innermost cable port 162 may be used to provide strain relief to the cable. For example, should the cable passing into the housing 12 be inadvertently or accidentally yanked or pulled on, the tabs 164 and 166 in the housing 12 and cover 160, respectively, prevent yanking or tugging of the cable from damaging the connection or electronics within the housing 12 of the control device 10. In another embodiment, the space defined between the upper and lower cable ports 162 may include an elastically deformable surface whereby the elastically deformable surface engages the outer surface of the cable to seal the cable passing through the cable ports 162 from permitting water to entering into the housing 12. In this instance, the strain relief is provided by the tabs 164 and 166. The elastically deformable surface is preferably included in both the recess between the upper and lower cable ports in the housing 12 and the cover 160. The cover 160 also includes a flange 180 for engaging the cover 12 and one or more seal ribs 182 for preventing water from entering into the housing 12 between the mating surfaces of the cover 160 and housing 12.

Figure 21:
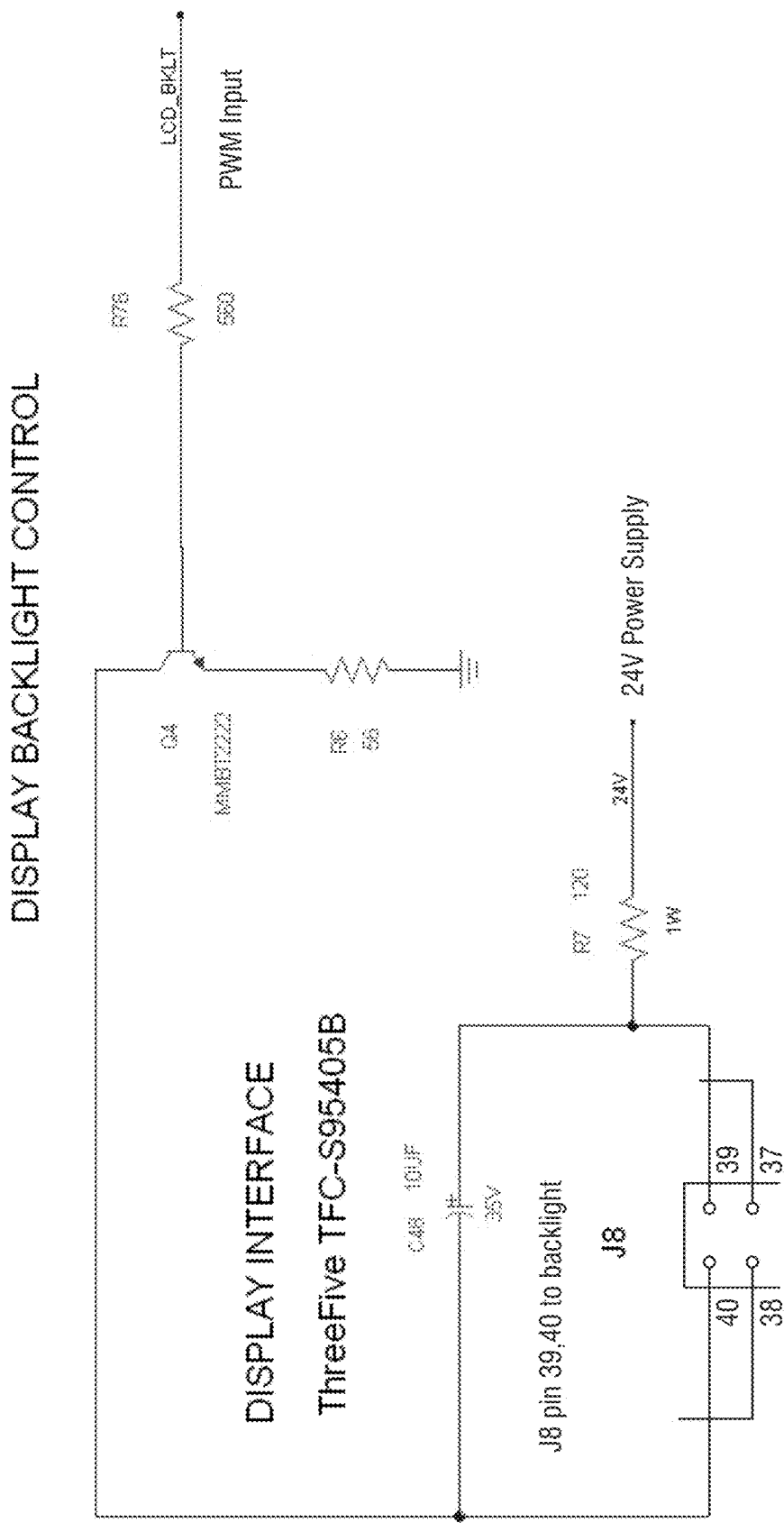
FIG. 21 is a circuit diagram illustrating more detail for the back light dimming circuit of the present invention.

FIG. 21 illustrates a circuit diagram from a DC control circuit for controlling backlight dimming of an LCD display 14 (shown in FIG. 1). The circuit can be adapted to include a DC output current for powering a lamp. A Pulse Width Modulator (PWM) can be included for modulating the output current. A capacitance filter can be connected for filtering the output current. Resistors can be included for providing electrical resistance in the DC control circuit. A transistor can be included to amplify or switch electronic signals and electrical power in the DC control circuit. In one possible embodiment of the present invention the "PWM Input" signal is driven directly off one of the PWM output pins of the microprocessor. Alternatively, any circuit capable of generating a PWM waveform may be used. Pin 37, 38, 39 and 40 of the connector at the bottom of the image connect to a set of white LEDs inside the display 14 that provide the backlight illumination. Pin 39 goes to the Anode of the LEDs, pin 40 goes to the Cathode. The frequency of the PWM waveform in according to the present invention is roughly 16 KHZ. The filter capacitor in the circuit is designed generally to match the PWM waveform frequency.

While the system here and before described is effectively adapted to fulfill the aforementioned objectives, it is to be understood that the invention is not intended to be limited to the specific preferred embodiments of the aspects disclosed and set forth above. Rather, it is to be taken as including all reasonable equivalence to the subject matter of the appended claims.

What is claimed is:

1. A controller configured for simultaneous operation of multiple associated utility devices, comprising:
    a primary controller having a multitasking operating system and a plurality of native control applications for controlling one or more native work operations, the primary controller including a primary control board, the primary control board including a field programmable gate array and a speaker alarm with volume control that compensates for ambient-noise, the primary control board connected in communication with an input/output board for a ware washing machine wherein the input/output board for the ware washing machine includes a conductivity module, a valve drive module, a ware wash dispensing I/O microprocessor module, a control system network communications module, a thermistor module and a digital sensor input module;
    a plurality of external control applications loaded onto the primary controller for controlling at least one or more external work operations associated with a utility device for providing services to said plurality of external control applications including an application for controlling at least one ware washing dispensing device;
    one or more of the native and external control applications operated simultaneously to monitor and control the native and external work operations;
    a user interface having sensory outputs associated with the plurality of native and external control applications, said sensory outputs comprising at least an alarm indicating that a wash tank of the ware washing machine should be drained and refilled; and
    said primary controller encased in a controller housing that is separate from the at least one ware washing dispensing device and said housing including at least one gasketless water tight seal.

2. The controller of claim 1, wherein said sensory outputs further comprising a training option, tutorial option and an assistance option for the one or more work operations of a hospitality or healthcare device.

3. The controller of claim 1, wherein said native and external work operations are monitored and controlled simultaneously.

4. The controller of claim 1, further comprising a user interface having a display with one or more graphical elements associated with the native and external work operations.

5. The controller of claim 1, further comprising one or more graphical elements on a display associated with the plurality of external control applications programmed onto the primary controller.

6. The controller of claim 1, further comprises a user interface having at least one sensory output associated with the plurality of native and external control applications.

7. The controller of claim 6, wherein the sensory output includes a visual and an audio output.

8. The controller of claim 6, wherein the user-perceived outputs include a language option to select a nationality appropriate language, selected from:
    a. a primary language; and
    b. one or more secondary languages.

9. The controller of claim 6, wherein the user-perceived outputs include a training option, tutorial option and/or assistance option for the one or more work operations of a hospitality or healthcare device.

10. The controller of claim 1, further comprising at least one I/O board connected in communication with the primary controller having a module with a plurality of device-specific control applications associated with one or more hospitality or healthcare device-specific work operations.

11. The controller of claim 10, further comprising a device-specific code loaded onto the primary controller for executing and monitoring the one or more hospitality or healthcare device-specific work operations.

12. The controller of claim 1, further comprising at least one hospitality or healthcare device-specific module connected to the primary controller to monitor and control the one or more external work operations.

\* \* \* \* \*

UNITED STATES PATENT AND TRADEMARK OFFICE
CERTIFICATE OF CORRECTION

| | | |
|---|---|---|
| PATENT NO. | : 10,795,324 B2 | |
| APPLICATION NO. | : 14/990545 | |
| DATED | : October 6, 2020 | |
| INVENTOR(S) | : Christopher D. Diller et al. | |

It is certified that error appears in the above-identified patent and that said Letters Patent is hereby corrected as shown below:

In the Specification

<u>In Column 1, Line 6:</u>
DELETE "divisional" before "application"
INSERT --continuation-- before "application"

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*